`US010067012B2`

United States Patent
Wang et al.

(10) Patent No.: US 10,067,012 B2
(45) Date of Patent: Sep. 4, 2018

(54) STRESS MEASUREMENT METHOD AND SYSTEM FOR OPTICAL MATERIALS

(71) Applicant: NATIONAL TSING HUA UNIVERSITY, Hsinchu (TW)

(72) Inventors: Wei-Chung Wang, Hsinchu (TW); Po-Chi Sung, Hsinchu (TW); Zheng-Yong Lu, Hsinchu (TW); Yu-Liang Yeh, Hsinchu (TW); Po-Yu Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/618,145

(22) Filed: Jun. 9, 2017

(65) Prior Publication Data

US 2018/0164169 A1    Jun. 14, 2018

(30) Foreign Application Priority Data

Dec. 9, 2016   (TW) .............................. 105140876 A

(51) Int. Cl.
*G01L 1/24* (2006.01)
*G03F 1/32* (2012.01)
*G01L 5/00* (2006.01)

(52) U.S. Cl.
CPC .............. *G01L 1/24* (2013.01); *G01L 5/0047* (2013.01); *G03F 1/32* (2013.01)

(58) Field of Classification Search
CPC ............ G01L 1/24; G01L 1/32; G01L 5/0047
USPC .......................................................... 356/33
See application file for complete search history.

(56) References Cited

U.S. PATENT DOCUMENTS

| 4,914,487 | A | * | 4/1990 | Croizer | ................... G01L 1/241 356/35 |
|---|---|---|---|---|---|
| 5,400,131 | A | * | 3/1995 | Stockley | ................. G01L 1/241 356/33 |

OTHER PUBLICATIONS

Wei-Chung Wang et al., "Investigation of Non-Equibiaxial Thin Film Stress by Using Stoney Formula", XIII SEM International Congress, dated on Jan. 6-9, 2016, paper and oral presentation, United States.

(Continued)

*Primary Examiner* — Hina F Ayub
(74) *Attorney, Agent, or Firm* — CKC & Partners Co., Ltd.

(57) ABSTRACT

A stress measurement method is provided of the present disclosure. The stress measurement method includes an image capturing procedure, a phase shift calculation procedure, an isochromatic intensifying procedure and a transformation procedure. The image capturing procedure is used to capture four light intensity images with four different phase angles of a sample. The phase shift calculation procedure is used to obtain an isochromatic retardation of the sample when the four light intensity images have sufficient light intensity values. The isochromatic intensifying procedure is used to calculate two enhanced light intensity values, the background of intensified isochromatic light intensity value and the amplitude of intensified isochromatic light intensity value to obtain an isochromatic retardation when the sample is in a low stress condition. The transformation procedure is used to transform the isochromatic retardation to a stress value of the sample.

15 Claims, 21 Drawing Sheets

(56) References Cited

OTHER PUBLICATIONS

Jo-Chi Sung et al., "A Correction Theory of Stress Determination of Glass Plate in Reflection Photoelasticity", 17th International Conference on Experimental Mechanics, dated on Jul. 3-7, 2016, paper and oral presentation, Greece.

Wei-Chung Wang et al., "Investigation of Non-equibiaxial Thin Film Stress by Using Stoney Formula", Advancement of Optical Methods in Experimental Mechanics, vol. 3: Proceedings of the 2016 Annual Conference on Experimental and Applied Mechanics, published in 2017, vol. 3, pp. 307-319, published by Springer International Publishing, Switzerland.

* cited by examiner (a) Dark field image I4_E in 0nm isochromatic retardation

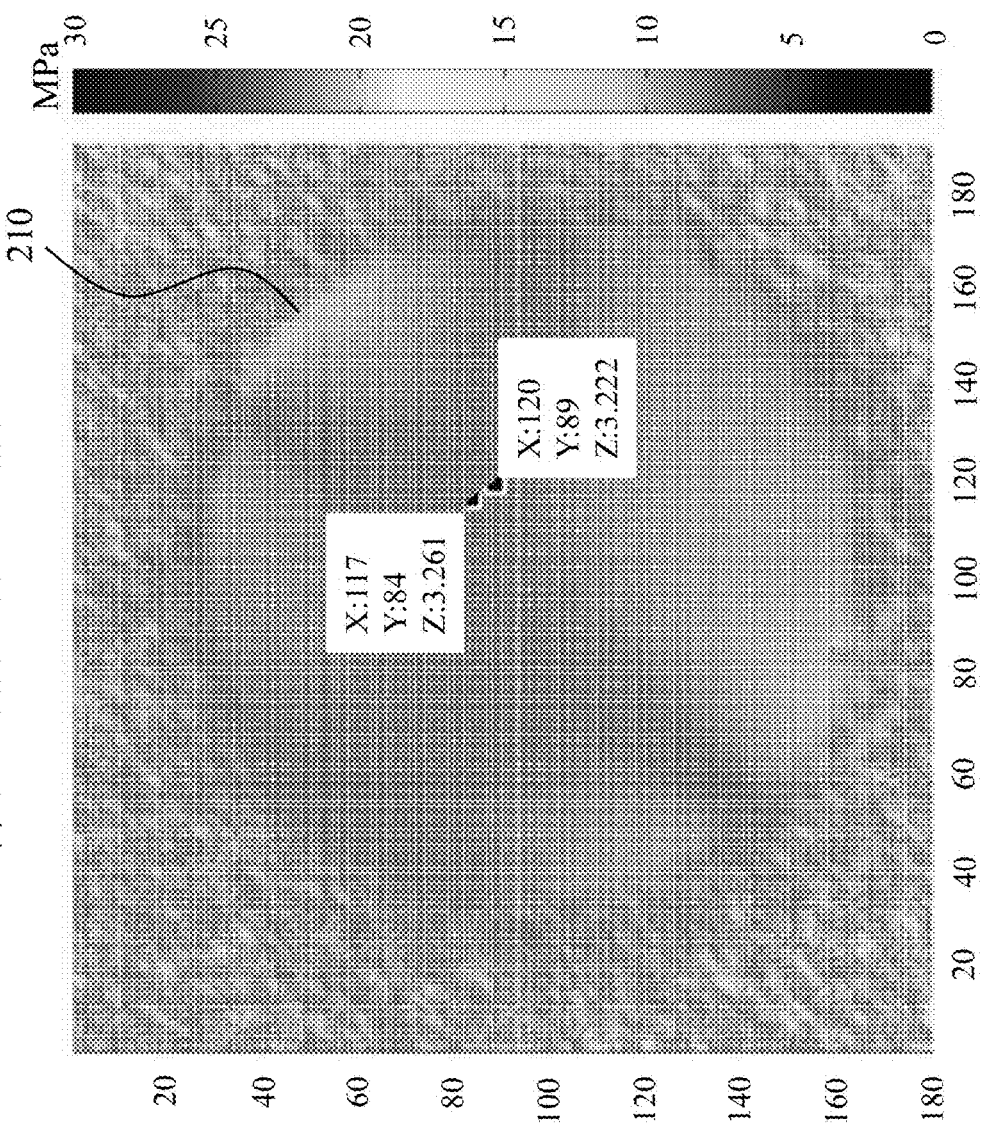

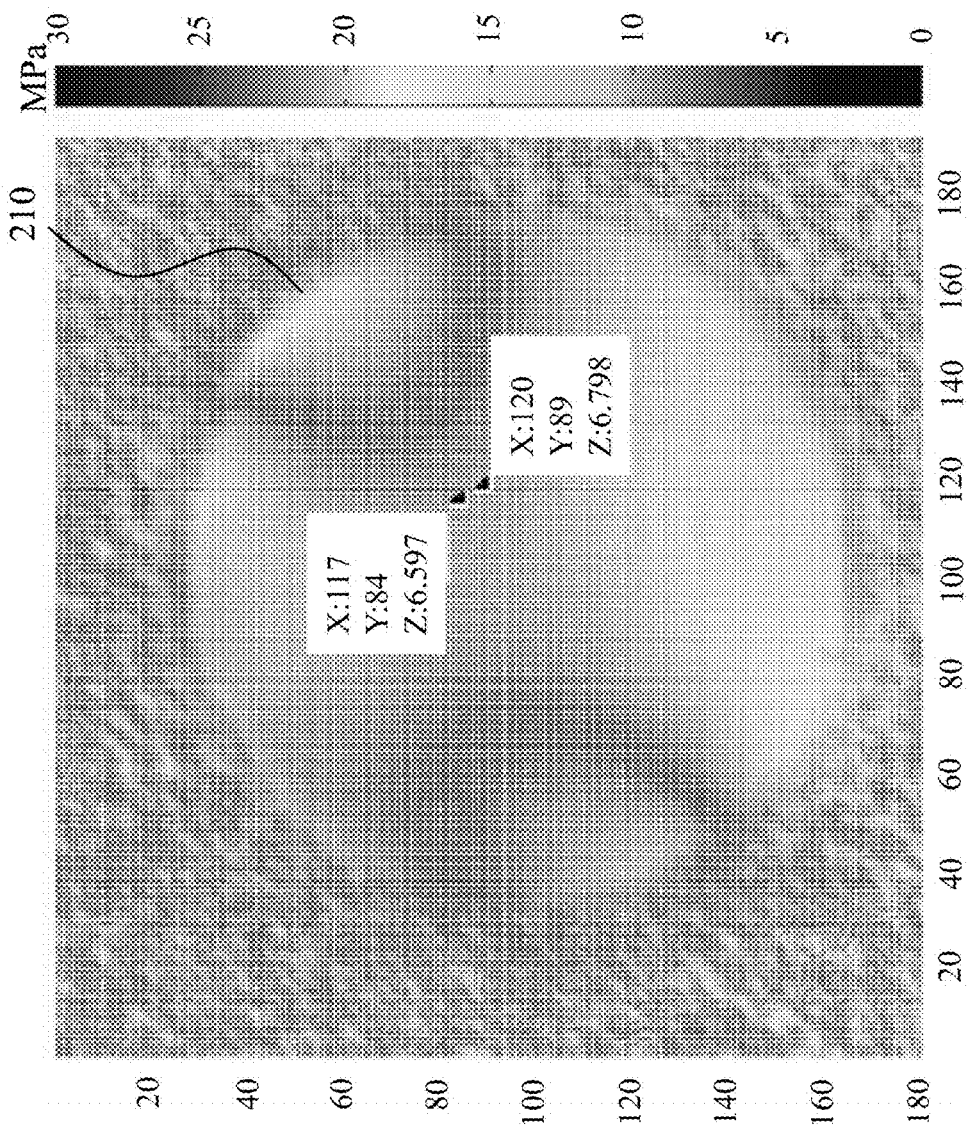

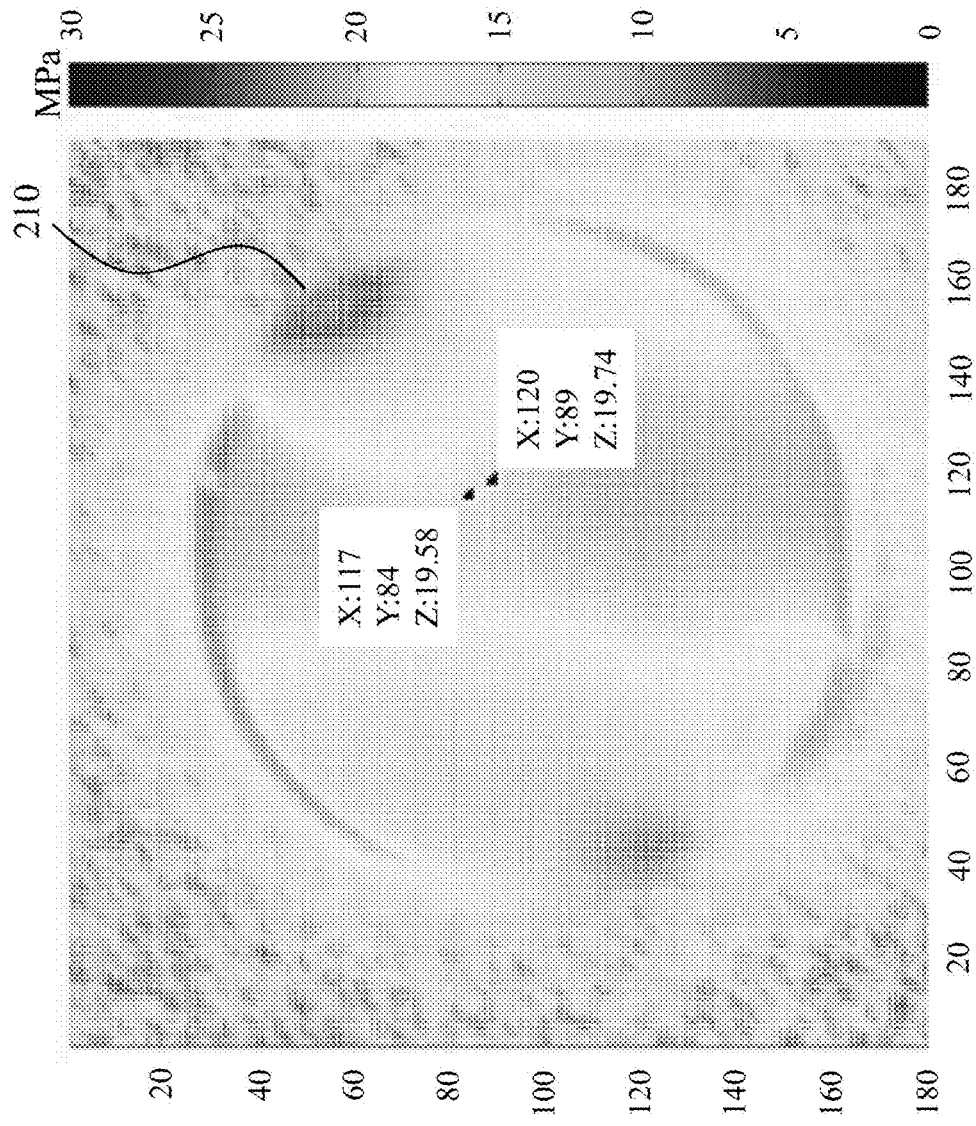

STRESS MEASUREMENT METHOD AND SYSTEM FOR OPTICAL MATERIALS

RELATED APPLICATIONS

This application claims priority to Taiwan Application Serial Number 105140876, filed Dec. 9, 2016, which is herein incorporated by reference.

BACKGROUND

Technical Field

The present disclosure relates to a stress measurement method and system for an optical material. More particularly, the present disclosure relates to a stress measurement method and system that are capable of obtaining precise measurement results and efficient measurement processes by simple hardware architecture.

Description of Related Art

The display industry and the MEMS semiconductor industry are held in high regards today. In those industries, planar optical components such as planar glasses are important components due to their functionalities as substrates or carriers during a manufacturing process. For example, a thin-film transistor array and a color filter both should be manufactured on glass substrates in a display panel manufacturing process. The thin-film transistor array and the color filter may be broken due to a residual stress of the glass substrates or an outer force exerts thereon. Moreover, the residual stress or the outer force may cause the liquid crystal layer be broken or generate non-uniform gaps, thereby producing defects on the display panel. The aforementioned defects are judgment indicators of the display panel qualities.

Furthermore, in the photolithography process of modern MEMS semiconductor manufacturing technology, the photo mask is manufactured by coating patterns on a planar glass. Therefore, the residual stress of the planar glass or the external force generated during the photo mask manufacturing process will cause the non-uniformity of the flatness, geometry and dimension of the mask patterns. Finally, the precision of the MEMS semiconductor manufacturing process will be decreased, and an inefficient or inoperable chip will be produced. From above, it has been known that stresses of the planar optical components (e.g. planar glass) will produce defects of the products in the display industry and the MEMS semiconductor industry. For eliminating the defects, the measurement of the residual stress of the planar optical components is required. Moreover, the measurement of the residual stress of the planar optical component should be performed in time, therefore there is a need to develop a stress measurement method and system that can rapidly and systematically perform the stress analysis.

A photoelasticity method is an efficient method for measuring an internal stress of an object that is transparent and has a temporary birefringence (e.g. a stress of a silicon wafer can be measured by an infrared light). However, the glass material has a low temporary birefringence, and the thickness thereof is thinner with the progress of the manufacturing technology. The flexible display has been a high priority in the development of the display industry. The thickness of the flexible planar glass has been reached to 50 μm thereby resulting the difficulty on measuring the residual stress of the planar glass. The conventional photoelasticity method and photoelasticity instrument have insufficient resolution and accuracy on measuring those low-level residual stresses of the planar glass. A low-level stress measurement instrument produced by the American HINDS Instruments Company can only perform one point stress measurement; if whole-field stresses information are desired, a point-to-point scan should be performed to construct the whole-field stress map. Therefore, the space resolution is low and the measurement time is huge, and it is not favorable for performing rapid measurements online. Moreover, this kind of low-level stress measurement instrument requires large quantities of optical components and electric devices, thereby increasing the implementation costs.

Furthermore, in the modern manufacturing processes of the display panel, TFT arrays and color filters are commonly formed on a surface of the planar glass. Similarly, patterns and reflected metal thin films are commonly formed on a surface of the planar glass when manufacturing the photomask. Therefore, a surface of a glass substrate can have no films, films with partial reflection and partial transmission or films with reflection but without transmission. For example, if a surface of a planar glass sample has reflective films or reflective components, the reflection photoelasticity is an effective stress measurement method. However, the method and instrument of the conventional reflection photoelasticity can only measure the stress on a totally reflective region of the planar glass, it cannot measure the region that has no reflection film or partial reflection film. If the region with no reflection film requires to be measured, a transmission photoelasticity should be used cooperatively. To the region that has partial reflection and partial transmission films, different sub-regions should be separated in accordance with different transmittance and reflectivity, and the different calibration procedures and stress measurements should be performed to individual sub-regions. Therefore, the method and instrument of the conventional reflection photoelasticity are complicated and highly costed. Furthermore, complicated image processing and recognition procedures should also be performed in the conventional stress measurement system, thus it is difficult to be applied on rapid online inspection. Moreover, the resolution and accuracy of the measurement are too low to measure the low-level residual stress of a thin planar glass.

SUMMARY

According to one aspect of the present disclosure, a stress measurement method for a sample whose optical material has transmission property is provided. The stress measurement method includes an image capturing procedure, a phase shift calculation procedure, an isochromatic intensifying procedure and a transformation procedure. The image capturing procedure is used to capture four light intensity images with four different phase angles of the sample; the phase shift calculation procedure is used to obtain an isochromatic retardation of the sample by calculating light intensity values of the four light intensity images when the four light intensity images have sufficient light intensity values; the isochromatic intensifying procedure is used to capture two intensified isochromatic light intensity images and obtain two enhanced light intensity values, a background of intensified isochromatic light intensity value and an amplitude of intensified isochromatic light intensity value when the sample is in a low stress condition so that a light intensity value of any one of the four light intensity images is insufficient, and then calculate the two enhanced light intensity values, the background of intensified isochromatic light intensity value and the amplitude of intensified isochromatic light intensity value to obtain the isochromatic retardation; and the transformation procedure is used to transform the isochromatic retardation to a stress value of the sample.

According to another aspect of the present disclosure, a stress measurement system employing the aforementioned stress measurement method is provided. The stress measurement system includes the sample, a polarizer, an analyzer, a light source, an image capturing device and a calculating device. The polarizer located in a first side of the sample. The analyzer is located in a second side opposite to the first side of the sample. The light source is located outside the polarizer and irradiates a light, wherein the light sequentially passes through the polarizer, the sample and the analyzer. The image capturing device is located outside the analyzer for receiving the light and captures the light intensity images or the intensified isochromatic light intensity images. The calculating device is connected to the image capturing device for performing the phase shift calculation procedure, the isochromatic intensifying procedure and the transformation procedure.

According to another aspect of the present disclosure, a stress measurement method for a sample and a calibration specimen whose optical materials have transmission properties is provided. The stress measurement method includes a reflection photoelasticity calibration procedure, an image capturing procedure, a phase shift calculation procedure, an isochromatic intensifying procedure and a transformation procedure. The reflection photoelasticity calibration procedure is used for receiving calibration light intensity images of the calibration specimen and obtaining a value of an amplitude of an incident electric field. The image capturing procedure is used to capture four light intensity images with four different phase angles of the sample. The phase shift calculation procedure is used to obtain an isochromatic retardation of the sample by calculating light intensity values of the four light intensity images with the value of the amplitude of the incident electric field when the four light intensity images have sufficient light intensity values. The isochromatic intensifying procedure is used to capture two intensified isochromatic light intensity images and obtain two enhanced light intensity values, a background of intensified isochromatic light intensity value and an amplitude of intensified isochromatic light intensity value when the sample is in a low stress condition so that a light intensity value of any one of the four light intensity images is insufficient, and then calculate the two enhanced light intensity values, the background of intensified isochromatic light intensity value, the amplitude of intensified isochromatic light intensity value and the value of the amplitude of the electric field to obtain the isochromatic retardation. The transformation procedure is used to transform the isochromatic retardation to a stress value of the sample.

According to another aspect of the present disclosure, a stress measurement system employing the aforementioned stress measurement method is provided. The stress measurement system includes the sample, the calibration specimen, a polarizer, and analyzer, a light source, an image capturing device and a calculating device. The polarizer is located in a first side of the sample or the calibration specimen. The analyzer is located in a second side, wherein an angle is formed between the first side and the second side. The light source is located outside the polarizer and irradiates a light, wherein the light is reflected to the analyzer by the sample or the calibration specimen. The image capturing device is located outside the analyzer for receiving the light and captures the light intensity images, the calibration light intensity images or the intensified isochromatic light intensity images. The calculating device is connected to the image capturing device for performing the reflection photoelasticity calibration procedure, the phase shift calculation procedure, the isochromatic intensifying procedure and the transformation procedure.

In the aforementioned aspects of the present disclosure, the optical materials of the samples can be one kind of temporary birefringence materials such as glass, polymer, silicon wafer, ceramic, etc.

BRIEF DESCRIPTION OF THE DRAWINGS

The present disclosure can be more fully understood by reading the following detailed description of the embodiment, with reference made to the accompanying drawings as follows:

FIGS. 8A to 8H show measurement results of SBC under different isochromatic retardations;

DETAILED DESCRIPTION

It is an object of the present disclosure to provide a stress measurement method and system that are capable of performing efficient and whole-field stress measurements under low stress conditions using simple hardware architecture. The stress measurement method and system can be applied to the sample that has reflection property and/or transmission property and whose optical material has transmission properties.

Figure 1:
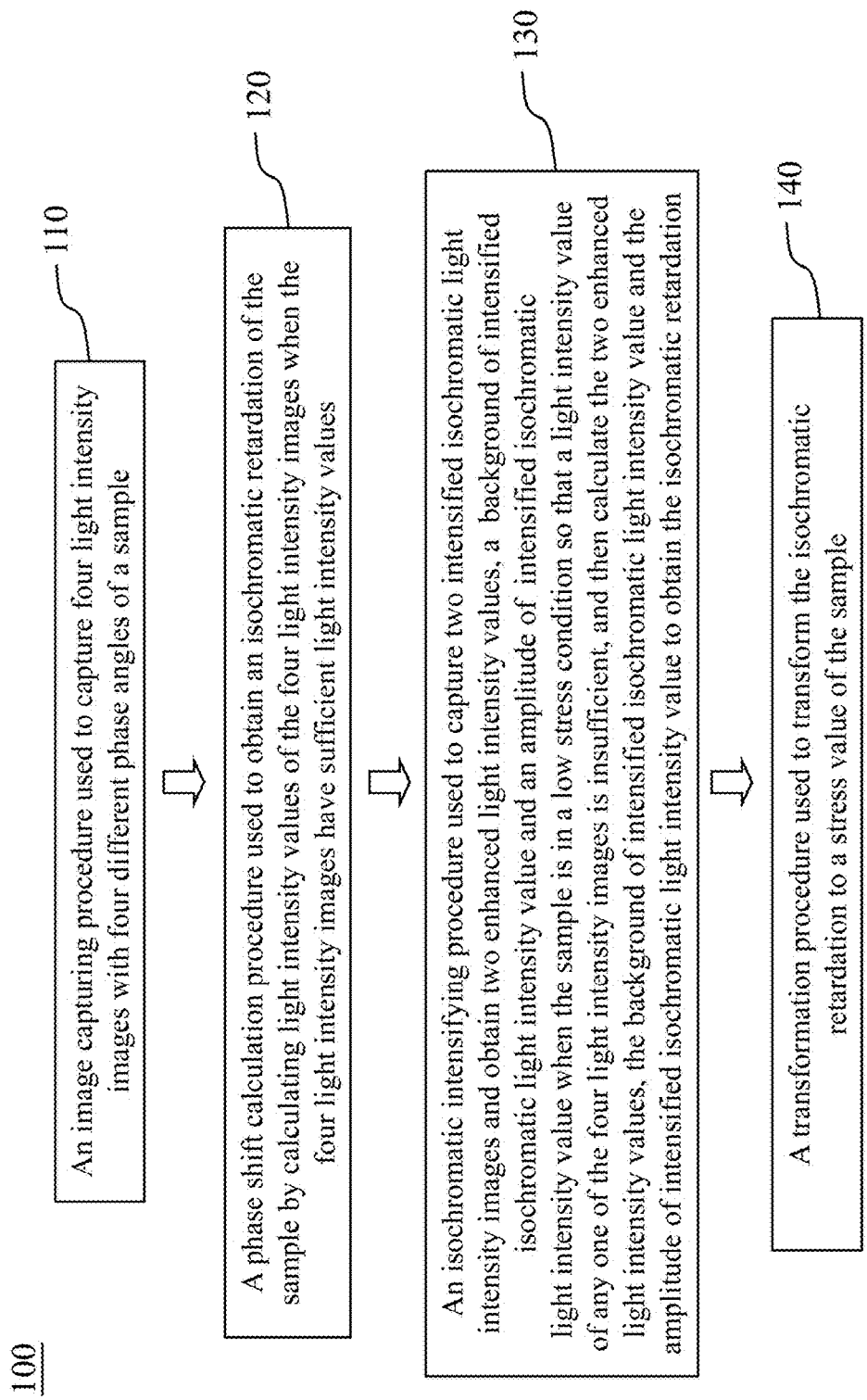
FIG. 1 is a flow diagram showing a stress measurement method according to one embodiment of the present disclosure.
Figure 2:
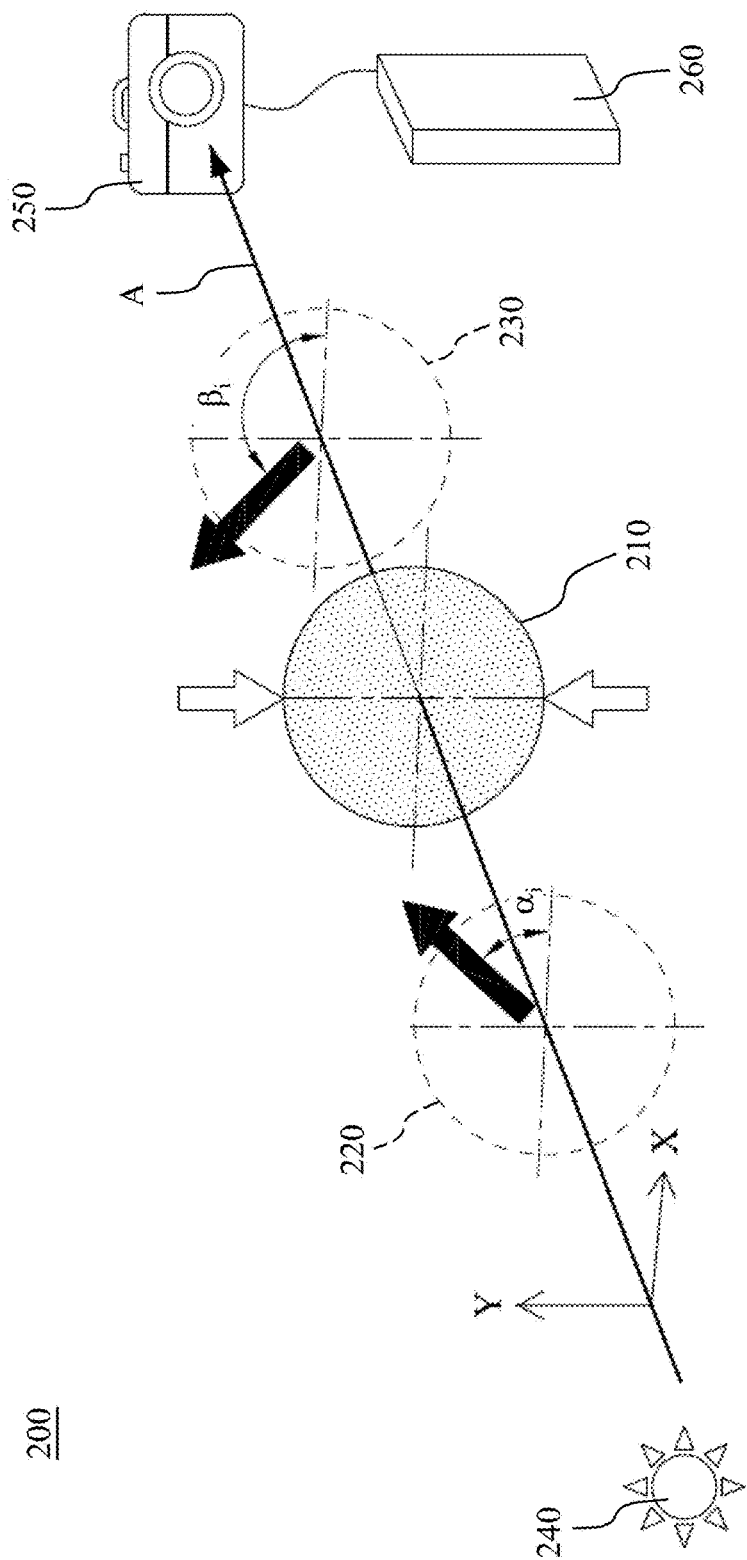
FIG. 2 is a schematic diagram showing a stress measurement system using the stress measurement method of FIG. 1.

FIG. 1 is a flow diagram showing a stress measurement method according to one embodiment of the present disclosure; FIG. 2 is a schematic diagram showing a stress measurement system using the stress measurement method of FIG. 1. The present disclosure provides a stress measurement method 100 of an optical material having transmission property. The stress measurement method 100 includes an image capturing procedure 110, a phase shift calculation procedure 120, an isochromatic intensifying procedure 130 and a transformation procedure 140. In FIG. 2, a stress measurement system 200 using the stress measurement method 100 of FIG. 1 is shown. The stress measurement system 200 includes a sample 210, a polarizer 220, an analyzer 230, a light source 240, an image capturing device 250 and a calculating device 260. The sample 210 has optical transmission property. The light source 240, the polarizer 220, the sample 210, the analyzer 230 and the image capturing device 250 are aligned coaxially in sequence. The polarizer 220 is located in one side of the sample 210, and the analyzer 230 is located in another side of the sample 210. The light source 240 is located outside the polarizer 220. The light source 240 irradiates a light A, and the light A passes through the polarizer 220, the sample 210 and the analyzer 230 in sequence. The image capturing device 250 is located outside the analyzer 230 for receiving the light A, and the image capturing device 250 can capture light intensity images or intensified isochromatic light intensity images. The calculating device 260 is connected to the capturing device 250 for executing the phase shift calculation procedure 120, the isochromatic intensifying procedure 130 and the transformation procedure 140.

The detail descriptions on the stress measurement method 100 of the sample 210 with transmission property using the stress measurement system 200 (i.e. a transmission photoelasticity instrument) are described in the following paragraphs. The calculating unit 260 is a computer.

In the image capturing procedure 110, the stress measurement system 200 is set up as a plane polarization field. Then, four light intensity images under four different phase angles of the sample 210 can be obtained through image capturing device 250 when the light A passes through the polarizer 220 and the analyzer 230. The light intensity general equation of the four light intensity images can be represented by $I_i$, as shown in the following equation (1):

$$I_i = I_b + I_a\left[\cos^2\frac{\delta}{2}\cos^2(\beta_i - \alpha_i) + \sin^2\frac{\delta}{2}\cos^2(\beta_i + \alpha_i - 2\theta)\right]. \quad (1)$$

In the phase shift calculation procedure 120, $I_b$ and $I_a$ are defined as a background of the light intensity value and an amplitude of the light intensity vale under a plane polarization field respectively; $\alpha_i$ and $\beta_i$ are defined as angles between a horizontal axis and optical axes of the polarizer 220 and the analyzer 230 respectively; $\delta$ is defined as an isochromatic retardation of the sample 210; $\theta$ is defined as a principal stress angle of the sample 210. Four simultaneous equations are required for solving the four unknown quantities $I_b$, $I_a$, $\delta$ and $\theta$. Therefore, the polarizer 220 and the analyzer 230 can be rotated to change angles $\alpha_i$ and $\beta_i$ to thereby obtaining light intensity equations under different angles, as shown in the following equations (2) to (5):

$$I_1 = I_b + I_a\left[\frac{1}{2} + \frac{1}{2}\sin^2\frac{\delta}{2}\sin 4\theta\right] \quad (\alpha_1 = 0°, \beta_1 = 45°); \quad (2)$$

$$I_2 = I_b + I_a\left[\frac{1}{2}\sin^2\frac{\delta}{2}(1 - \cos 4\theta)\right] \quad (\alpha_2 = 0°, \beta_2 = 90°); \quad (3)$$

$$I_3 = I_b + I_a\left[\frac{1}{2} - \frac{1}{2}\sin^2\frac{\delta}{2}\sin 4\theta\right] \quad (\alpha_3 = 45°, \beta_3 = 90°); \text{ and} \quad (4)$$

$$I_4 = I_b + I_a\left[\frac{1}{2}\sin^2\frac{\delta}{2}(1 + \cos 4\theta)\right] \quad (\alpha_4 = 45°, \beta_4 = 135°). \quad (5)$$

When calculating the above equations (2) to (5), it should be known that the rotations of the polarizer 220 and the analyzer 230 have regularity. For example, when a light intensity value $I_1$ is captured under $\alpha_1=0$ degree and $\beta_1=45$ degrees, the light intensity $I_2$, $I_3$ and $I_4$ can be captured by cyclically increasing 45 degrees of the rotation angle of the analyzer 230 (i.e. $\alpha_2=0$ degree and $\beta_2=90$ degrees), increasing 45 degrees of the rotation angle of the polarizer 220 ($\alpha_3=45$ degrees and $\beta_3=90$ degrees), increasing 45 degrees of the rotation angle of the analyzer 230 ($\alpha_4=45$ degrees and $\beta_4=135$ degrees), and increasing 45 degrees of the rotation angle of the polarizer 220 ($\alpha_1=90$ degrees and $\beta_1=135$ degrees (the same light intensity value as $I_1$ can be obtained under this angle arrangement), and it can back to the light intensity $I_1$. Therefore, this kind of measurement instrument can be performed cyclically for the next round, and it is favorable for developing automatic measurement.

An equation (6) can be obtained by subtracting the equation (4) from the equation (2); and an equation (7) can be obtained by subtracting the equation (3) from the equation (5):

$$I_1 - I_3 = I_a \sin^2\frac{\delta}{2}\sin 4\theta; \text{ and} \quad (6)$$

$$I_4 - I_2 = I_a \sin^2\frac{\delta}{2}\cos 4\theta. \quad (7)$$

Then the following equations (8) and (9) can be obtained by calculating the equations (6) and (7):

$$\theta = \frac{1}{4}\tan^{-1}_{2\pi}\left(\frac{I_1 - I_3}{I_4 - I_2}\right); \text{ and} \quad (8)$$

$$\sqrt{(I_4 - I_2)^2 + (I_1 - I_3)^2} = I_a\sin^2\frac{\delta}{2}. \quad (9)$$

The equation (8) represents a relationship of the principal stress angle $\theta$ of the sample 210. In equation (8), the $\tan^{-1}_{2\pi}$ denotes the arctangent operation whose calculation value is in the interval of $2\pi$. The equation (9) represents the relationship of the light intensity value with $\sin^2(\delta/2)$ and without $\theta$. Furthermore, an equation (10) can be obtained by adding the equation (2) to the equation (4); and an equation (11) can be obtained by adding the equation (3) to the equation (5):

$$I_1 + I_3 = 2I_b + I_a; \text{ and} \quad (10)$$

$$I_4 + I_2 = 2I_b + I_a\sin^2\frac{\delta}{2}. \quad (11)$$

An equation (12) can be obtained by calculating the equations (10) and (11):

$$I_1 + I_3 - I_4 - I_2 = I_a \cos^2 \frac{\delta}{2}. \tag{12}$$

The equation (12) represents the relationship of the light intensity value with $\cos^2(\delta/2)$ and without θ. Then, the phase shift calculation procedure 120 can be used to calculate the light intensity for obtaining an isochromatic retardation δ of the sample 210. For example, the equations (9) and (12) can be calculated to obtain the expression of the isochromatic retardation δ, as shown in the following equation (13):

$$\delta = 2\tan^{-1}\sqrt{\frac{\sqrt{(I_4-I_2)^2+(I_1-I_3)^2}}{I_1+I_3-I_4-I_2}}. \tag{13}$$

Form above calculation procedures, the equation (8) represents the relationship of the principal stress angle θ of the sample 210; and the equation (13) represents the relationship of the isochromatic retardation δ of the sample 210. It is already known that the isochromatic retardation δ and the principal stress angle θ can be obtained by simultaneously calculating the light intensity values of the light intensity images of different rotation angles of the polarizer 220 and the analyzer 230, as described above.

When any one of the light intensity images has an insufficient light intensity value $I_i$, the image capturing device 250 cannot obtain the light intensity value $I_i$ effectively. In the present disclosure, the isochromatic intensifying procedure 130 is used to effectively obtain the sufficient value of the light intensity $I_i$ by the image capturing device 250 in order to calculate correct stress value. In one embodiment of the present disclosure, the exposure time is increased to obtain sufficient light intensity values. In possible embodiments, the intensity of the light source 240 can also be increased to obtain sufficient light intensity values. In the isochromatic intensifying procedure 130, the exposure time of the image capturing device 250 (e.g. a camera) will be increased to enhance the received light intensity of the low stress region. The ratio of the increase of the exposure time is according to the situation of the internal stress of the sample 210. For example, the ratio of the increase of the exposure time needs to make the enhanced light intensity values of the aforementioned equations (3) and (5) be sufficient to be analyzed and not overexposured.

The light intensity value of the isochromatics of the sample 210 with low stress is insufficient when measured by the phase shift calculation procedure 120. The following embodiments describe how the isochromatic light intensity can be intensified by increasing the exposure time of the image capturing device 250. The main concept is that in addition to the light intensity images of different phases shown in the equations (2) to (5), the enhanced light intensity images in dark field situations (i.e. the situations of equations (3) and (5)) are considered and captured. Besides, the isochromatic light intensity equation (11) is used to obtain the isochromatic retardation. After increasing the exposure time of the image capturing device 250, the above equations (3), (5) and (11) can be rewritten to the following equations (14a), (14b) and (15):

$$I_{2\_E} = I_{b\_E} + I_{a\_E}\left[\frac{1}{2}\sin^2\frac{\delta}{2}(1-\cos 4\theta)\right] \ (\alpha_2 = 0°, \beta_2 = 90°); \tag{14a}$$

$$I_{4\_E} = I_{b\_E} + I_{a\_E}\left[\frac{1}{2}\sin^2\frac{\delta}{2}(1+\cos 4\theta)\right] \ (\alpha_4 = 45°, \beta_4 = 135°); \text{ and} \tag{14b}$$

$$\Rightarrow I_{4\_E} + I_{2\_E} = 2I_{b\_E} + I_{a\_E}\sin^2\frac{\delta}{2}. \tag{15}$$

where $I_{4\_E}$ and $I_{2\_E}$ are two values of the enhanced light intensities of equations (5) and (3) after increasing the exposure time of the image capturing device 250 (i.e. the two enhanced light intensity values), respectively. $I_{b\_E}$ and $I_{a\_E}$ are a background and an amplitude of light intensity of the isochromatics after increasing the exposure time of the image capturing device 250 (i.e. a background and an amplitude of intensified light intensity value), respectively. δ is an isochromatic retardation. Then, the equation (15) can be rewritten to the following equation (16):

$$\frac{I_{4\_E} + I_{2\_E} - 2I_{b\_E}}{I_{a\_E}} = \sin^2\frac{\delta}{2}. \tag{16}$$

In the equation (11), $I_a$ is an amplitude of light intensity under a plane polarization field; $I_b$ is a background of light intensity under the plane polarization field. In $I_b$, the environmental error, the error of the image capturing device 250 and the errors of the polarizer 220 and analyzer 230 are also involved. In the equation (11), under a low stress situation, the value of $I_a \sin^2(\delta/2)$ will be close to or smaller than the value of $2I_b$, the light intensity of $I_a \sin^2(\delta/2)$ will be easily disturbed by the noise of $2I_b$, therefore it is difficult to extract a light intensity of $I_a \sin^2(\delta/2)$ with no noise and sufficient intensity from the light intensity value of equation (11). An improved result when increasing the exposure time is shown in the equation (15). In the equation (15), the value of $I_{a\_E} \sin^2(\delta/2)$ will be greater than the value of $2I_{b\_E}$; therefore the light intensity of $I_{a\_E} \sin 2(\delta/2)$ can be easily divided from $I_b$, and the calculation of $I_{a\_E} \sin^2(\delta/2)$ will almost not be disturbed by the noise in $2I_{b\_E}$. In one example, the image capturing device 250 is a CCD camera and has a mechanical shutter. The CCD camera can perform a calibration to the dark region of the captured image to further reduce the error in $2I_{b\_E}$. In the equation (16), $I_{b\_E}$ can be obtained by the conventional calibration technology. For example, $I_{b\_E}$ can be obtained through a fitting processing of a sine regression function or a calibration specimen without a stress. A relationship between $I_{a\_E}$, an exposure time s and an increased exposure time $s_E$ can be represented by the following equation (17):

$$I_{a\_E} = I_a \frac{s_E}{s}; \tag{17}$$

wherein a can be calculated from the equations (9) and (12), and can be represented by the following equation (18):

$$I_a = I_1 + I_3 - I_4 - I_2 + \sqrt{(I_4-I_2)^2+(I_1-I_3)^2} \tag{18};$$

the isochromatic retardation δ can be obtained by substituting the equations (17) and (18) into the equation (16), which is represented by the following equation (19);

$$\delta = 2\sin^{-1}\sqrt{\frac{I_{4\_E} + I_{2\_E} - 2I_{b\_E}}{I_1 + I_3 - I_4 - I_2 + \sqrt{(I_4 - I_2)^2 + (I_1 - I_3)^2}} \frac{s}{s_E}} . \quad (19)$$

In fact, the equation (17) will be changed with different image capturing device 250. However, it just needs to substitute the corresponding equation and the equation (18) into the equation (16) to obtain the corresponding relationship of the isochromatic retardation δ. From above, the principal stress angle θ can be obtained by the following equation (20):

$$\theta = \frac{1}{2}\tan^{-1}\left(\frac{\sqrt{I_{2\_E} - I_{b\_E}}}{\sqrt{I_{4\_E} - I_{b\_E}}}\right). \quad (20)$$

Finally, through the transformation procedure 140, the isochromatic retardation δ can be transformed to a stress value in accordance with the Stress-Optic Law.

Figure 6:
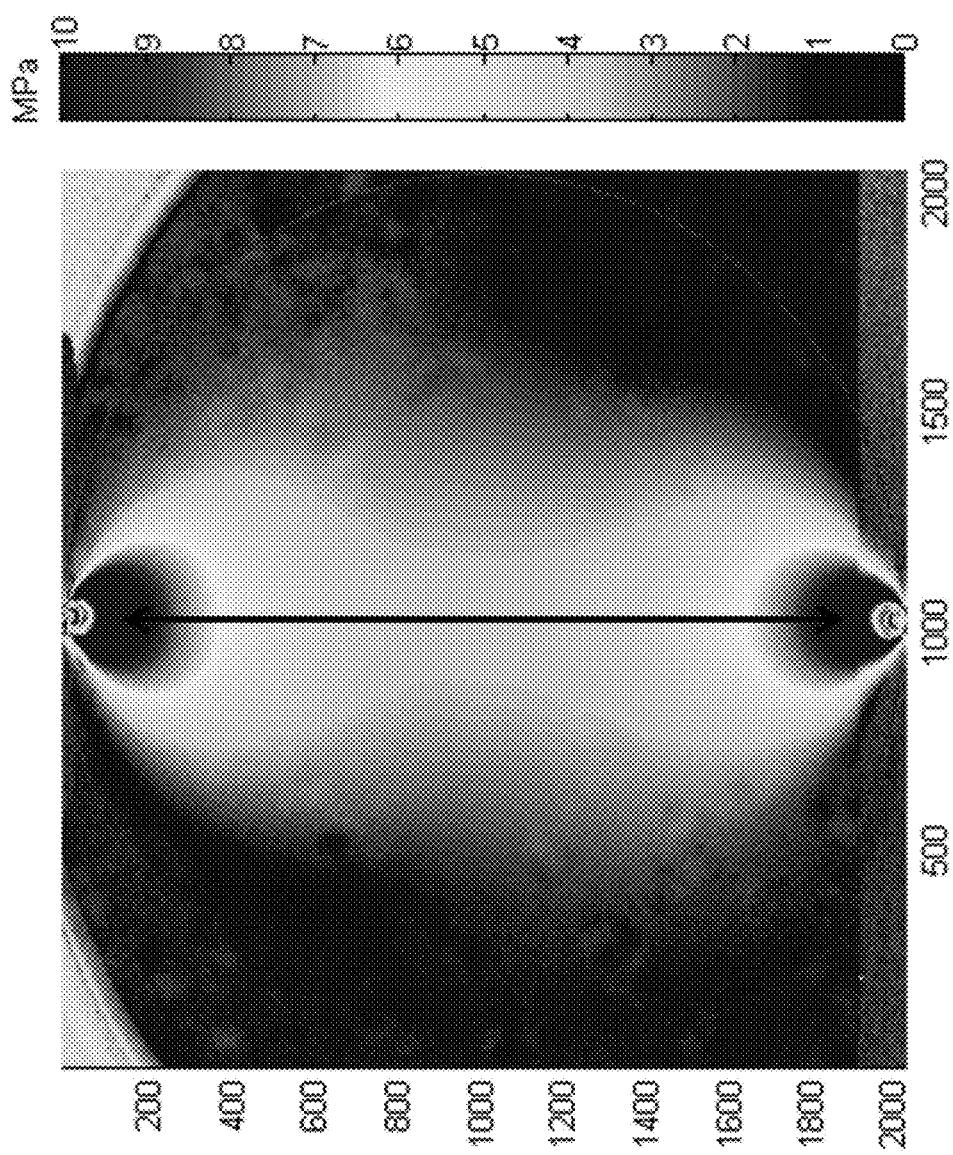
FIG. 6 shows a principal stress difference of the glass disc of FIGS. 5A to 5D, which is obtained from the transmission type stress measurement method.
Figure 7:
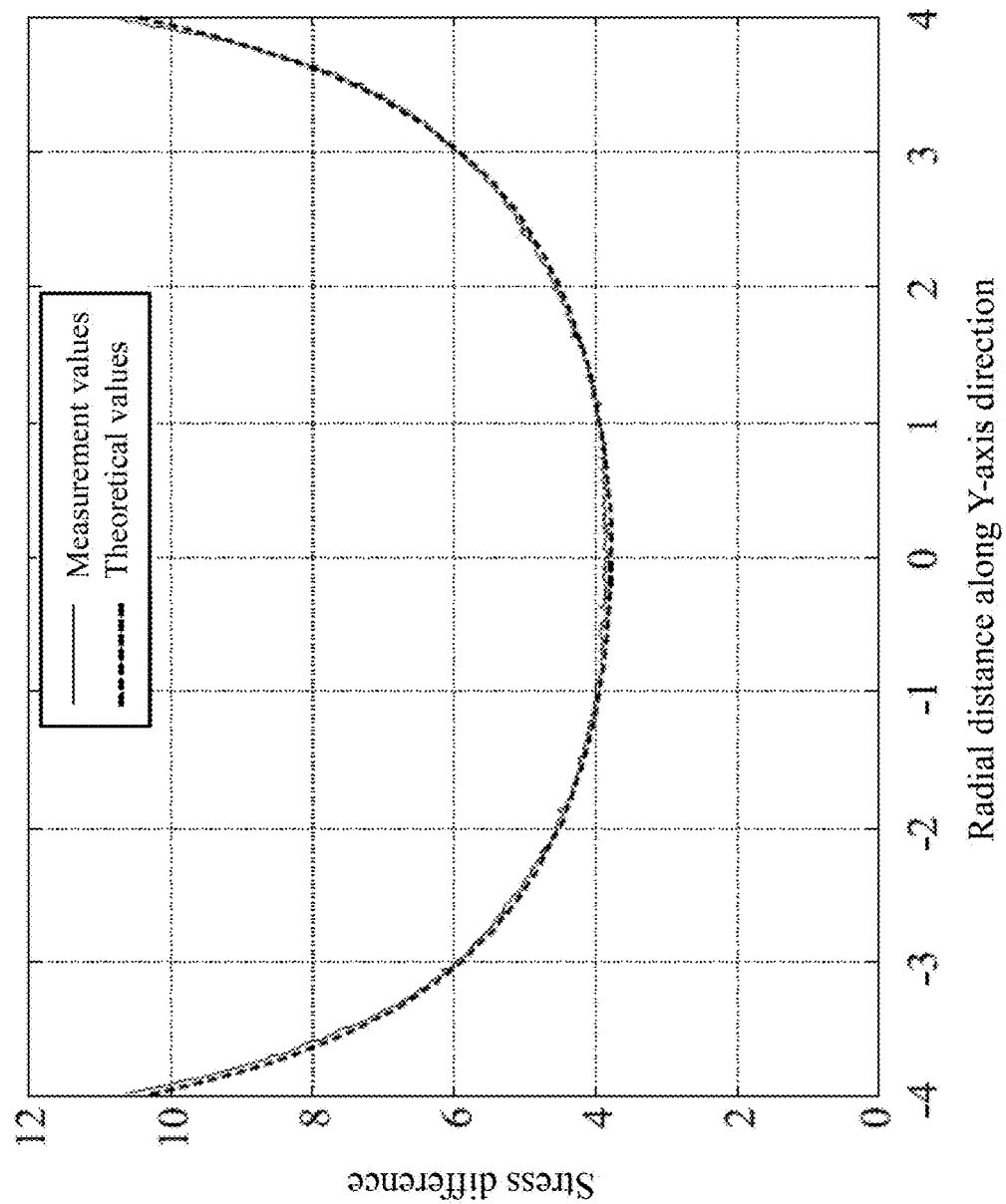
FIG. 7 shows a comparison between measurement and theoretical values of the principal stress difference along a Y-axis diametrical direction of the glass disc of FIG. 6.

Please refer to FIGS. 5A to 8H. In the embodiment, the stress of the sample 210 (glass disc) is measured by the stress measurement system 200 while a diametral load up to 91.5 Kg is added. The material of the sample 210 is a white planar glass No. B270 manufactured by the SCHOTT™ Company. The exposure time of a CCD camera (image capturing device 250) is 0.3 second. Four light intensity images (FIGS. 5A to 5D) of the sample 210 respectively corresponding to the equations (2) to (5) can be obtained through the CCD camera when a diametral load 91.5 Kg is added to the sample 210. The measurement result of the four light intensity images can be substituted into equation (13) to perform the phase shift calculation to obtain the whole-field isochromatic retardation. Then, the whole-field stress can be obtained by substituting the isochromatic retardation into the Stress-Optic Law. The result of the whole-field principal stress difference of the sample having 91.5 Kg load by applying the transmission type stress measurement method (i.e. the stress measurement method 100) is shown in FIG. 6. The stress values of the points located within 4 cm range of the radius of the sample 210 along the Y-axis direction (shown as arrows) are extracted and compared with the theoretical values. The comparison result is shown in FIG. 7. In FIG. 7, the root mean square of the differences between the measurement values and the theoretical values is 0.0869 MPa, and the percentage of the average absolute value of the differences is 1.23%, which means a precise and accurate result of the present disclosure can be achieved.

A SBC (Soleil-Babinet Compensator) can be used for verifying the correctness and the accuracy of the isochromatic intensifying procedure 130. An expected isochromatic retardation obtained by the SBC is used as a standard value. Then the polarizer 220 and the analyzer 230 are rotated for changing $\alpha_i$ and $\beta_i$ to obtain the light intensity information corresponding to the equations (2) to (5) and the intensified isochromatic light intensity information corresponding to the equations 14a and 14b, and then the light intensity images of the above light intensity information can be captured by a CCD camera. Then, the isochromatic retardation δ can be obtained by substituting the values of the light intensity images into the equation (19). The accuracy of the stress measurement system 200 then can be verified through comparing the isochromatic retardation δ with the standard value given by the SBC.

The exposure time s of the CCD camera is set to 0.1 sec., the increased exposure time $s_E$ is 4 sec. The SBC can be adjusted for giving different isochromatic retardations δ. The isochromatic retardations δ are given by 1.663 nm, 3.326 nm, 6.652 nm, 9.979 nm, 13.305 nm, 16.631 nm and 19.957 nm respectively by adjusting the SBC.

Figure 8A:
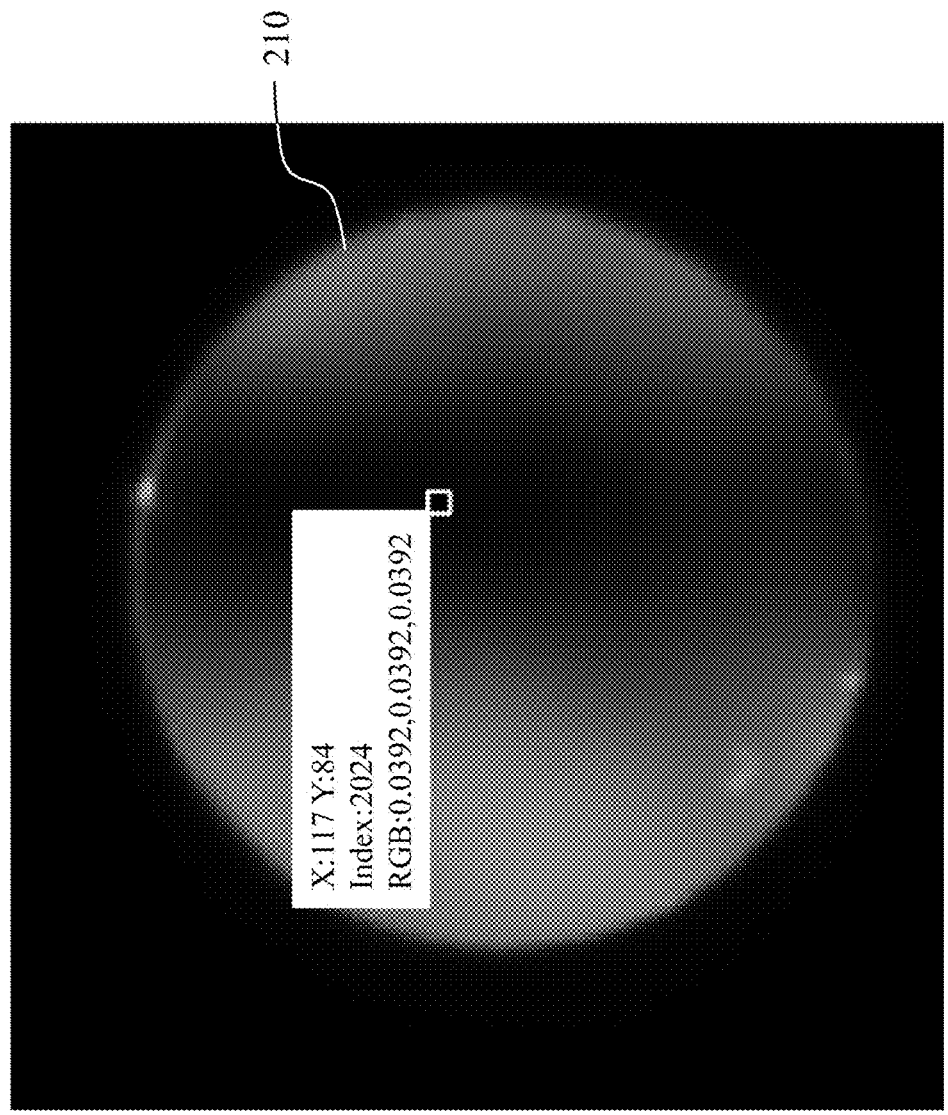
Figure 8B:
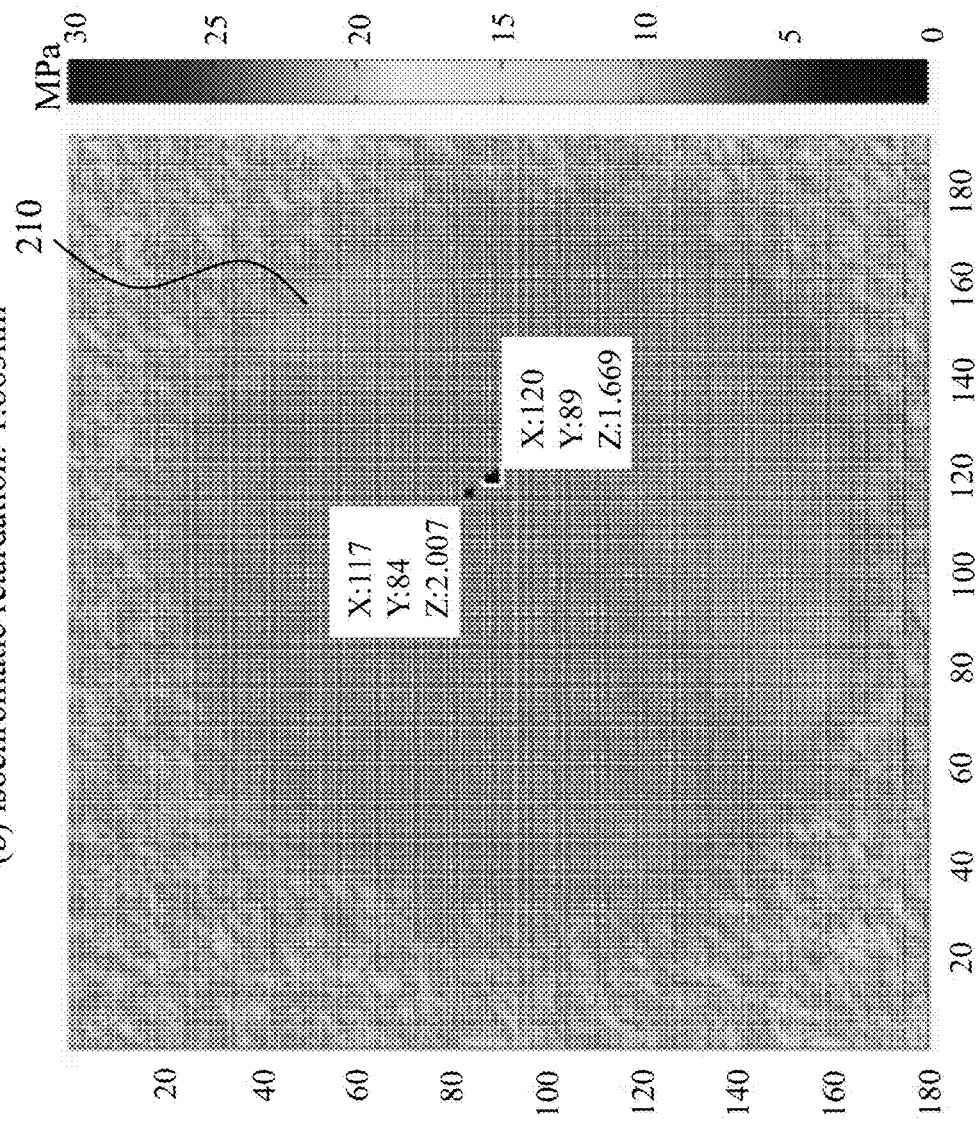
Figure 8E:
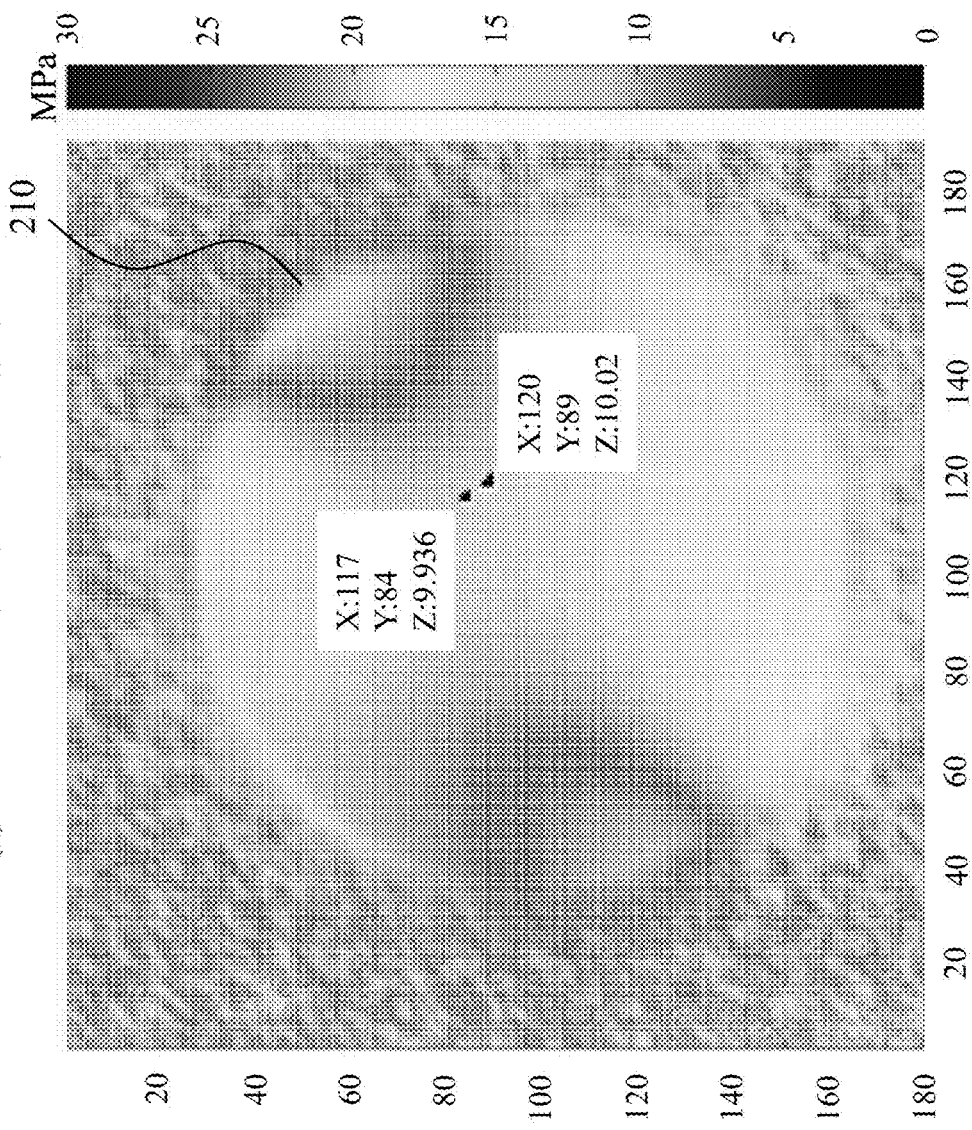
Figure 8F:
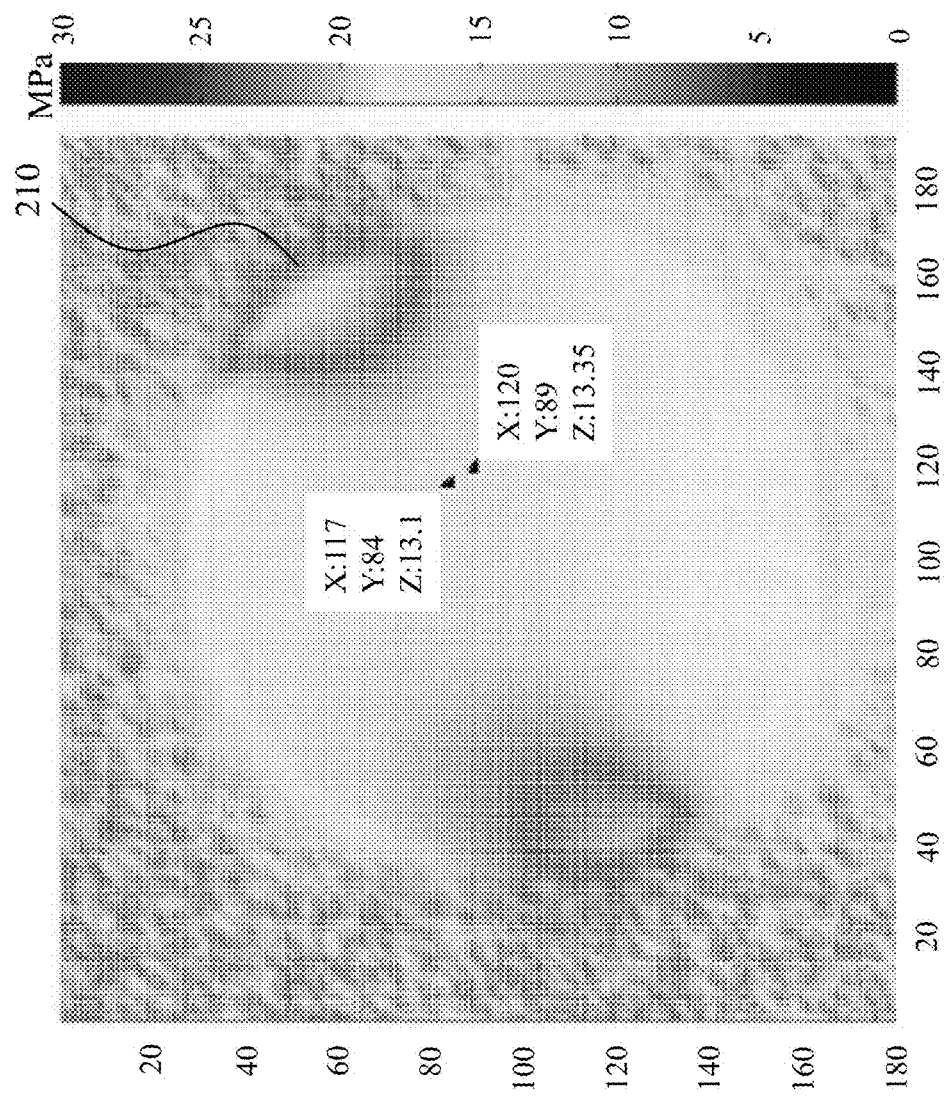
Figure 8G:
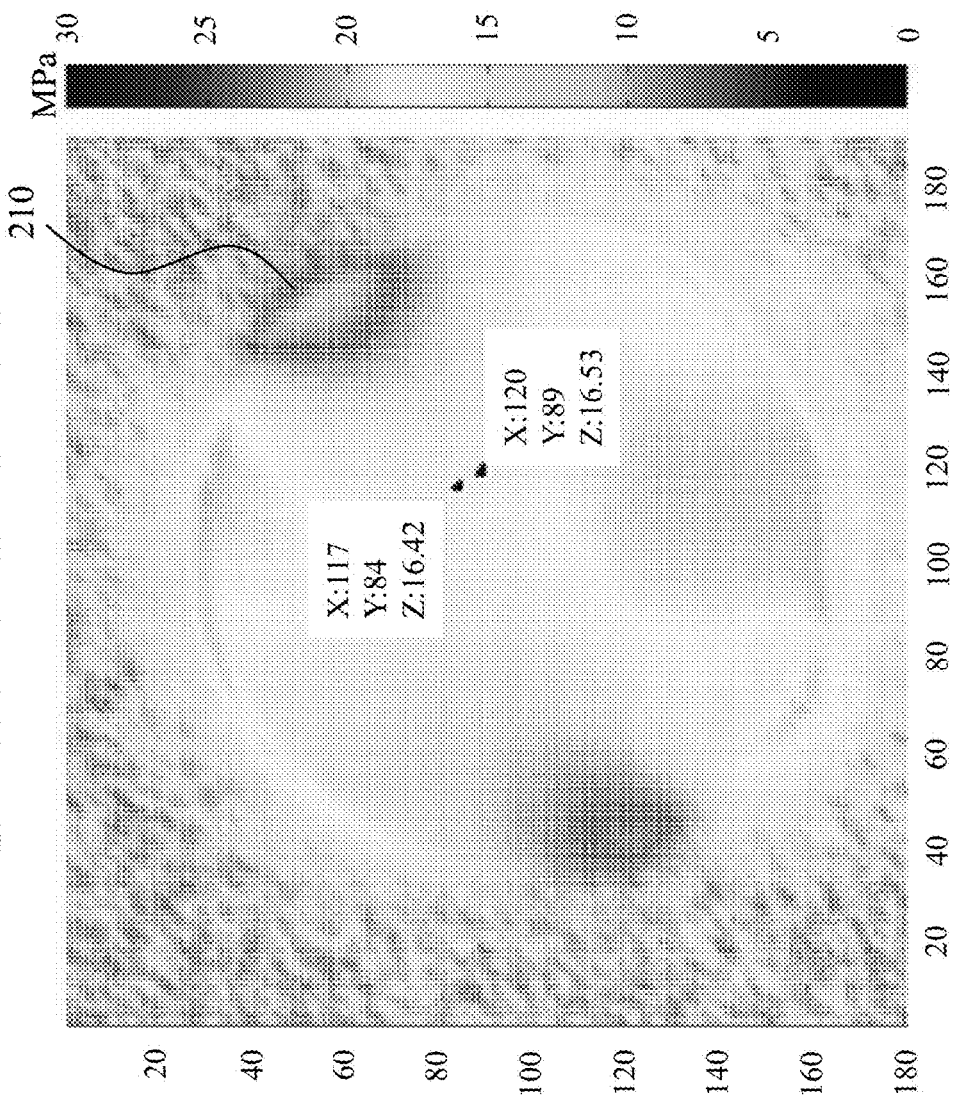

FIGS. 8A to 8H show measurement results of SBC under different isochromatic retardations. In FIG. 8A, the isochromatic retardation δ at the indicated point is 0 nm so that the indicated point is a basis point of retardation. Therefore, the isochromatic retardation δ at the basis point given by the SBC is defined as the standard value.

The measurement results of the standard retardations 1.663 nm, 3.326 nm, 6.652 nm, 9.979 nm, 13.305 nm, 16.631 nm and 19.957 nm which given by the SBC are shown in FIGS. 8B to 8H. The measurement values are 2.007 nm, 3.261 nm, 6.597 nm, 9.936 nm, 13.10 nm, 16.42 nm and 19.58 nm respectively. The maximum absolute difference between the measurement results and the standard retardations is 0.377 nm and the average absolute difference is 0.162 nm. The root mean square of the difference can be represented by the following equation:

$$RMS = \sqrt{\frac{\sum_{i=1}^{n}(x_i - \bar{x}_{is})^2}{n}} .$$

where $x_i$ is a measurement result; $\bar{x}_{is}$ is a standard retardation given by the SBC; and n is the measurement number. The calculation result of the RMS value is 0.209 nm.

From the measurement results, it is shown that the isochromatic intensifying procedure 130 can obtain small isochromatic retardation with small errors. Therefore, the stress measurement method and system of the present disclosure can be applied to the sample 210 having transmission property, and have simple measurement procedures, high measurement accuracy and correctness, especially for the low-level stress measurement.

Figure 3:
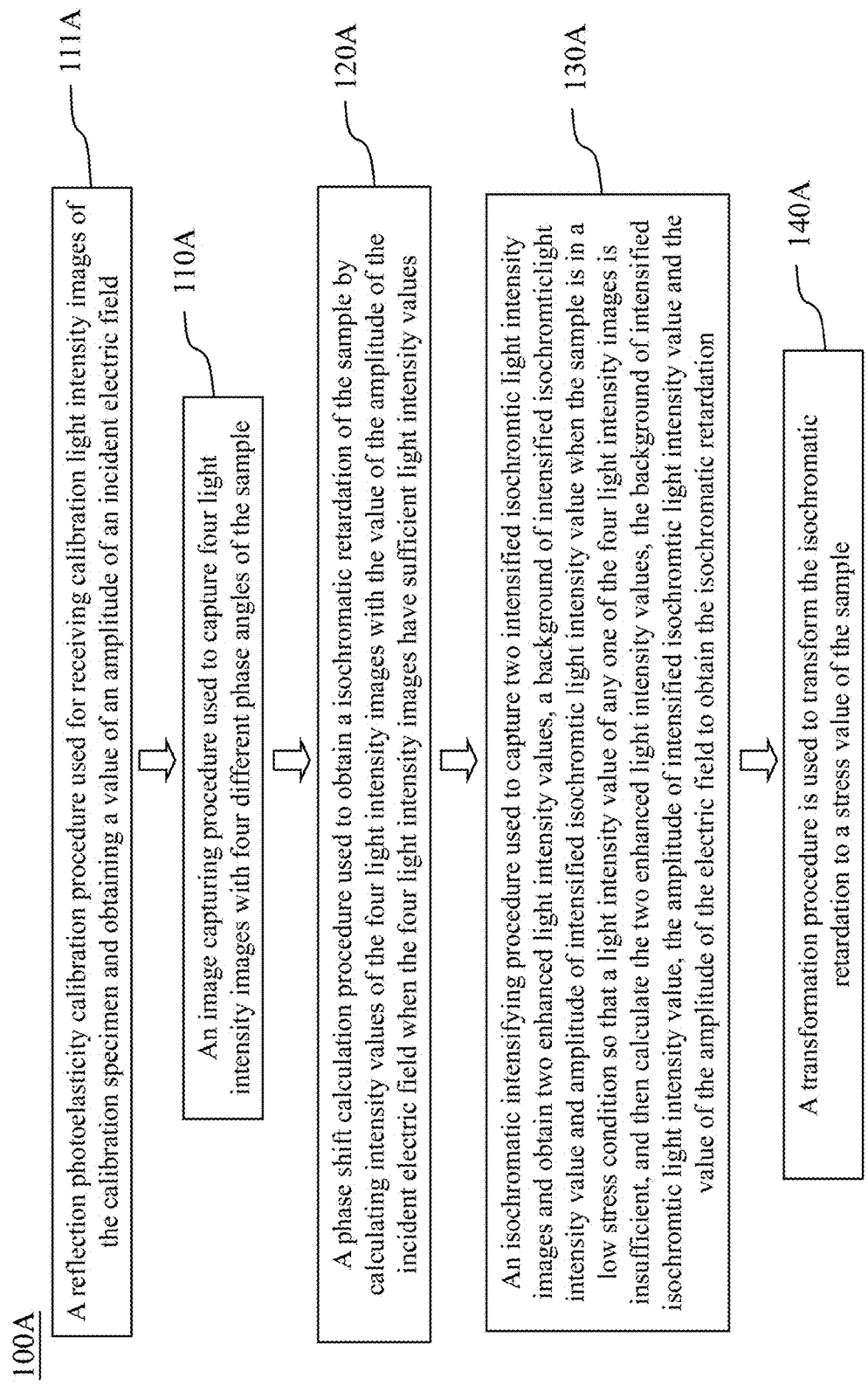
FIG. 3 is a flow diagram showing a stress measurement method according to another embodiment of the present disclosure.
Figure 4:
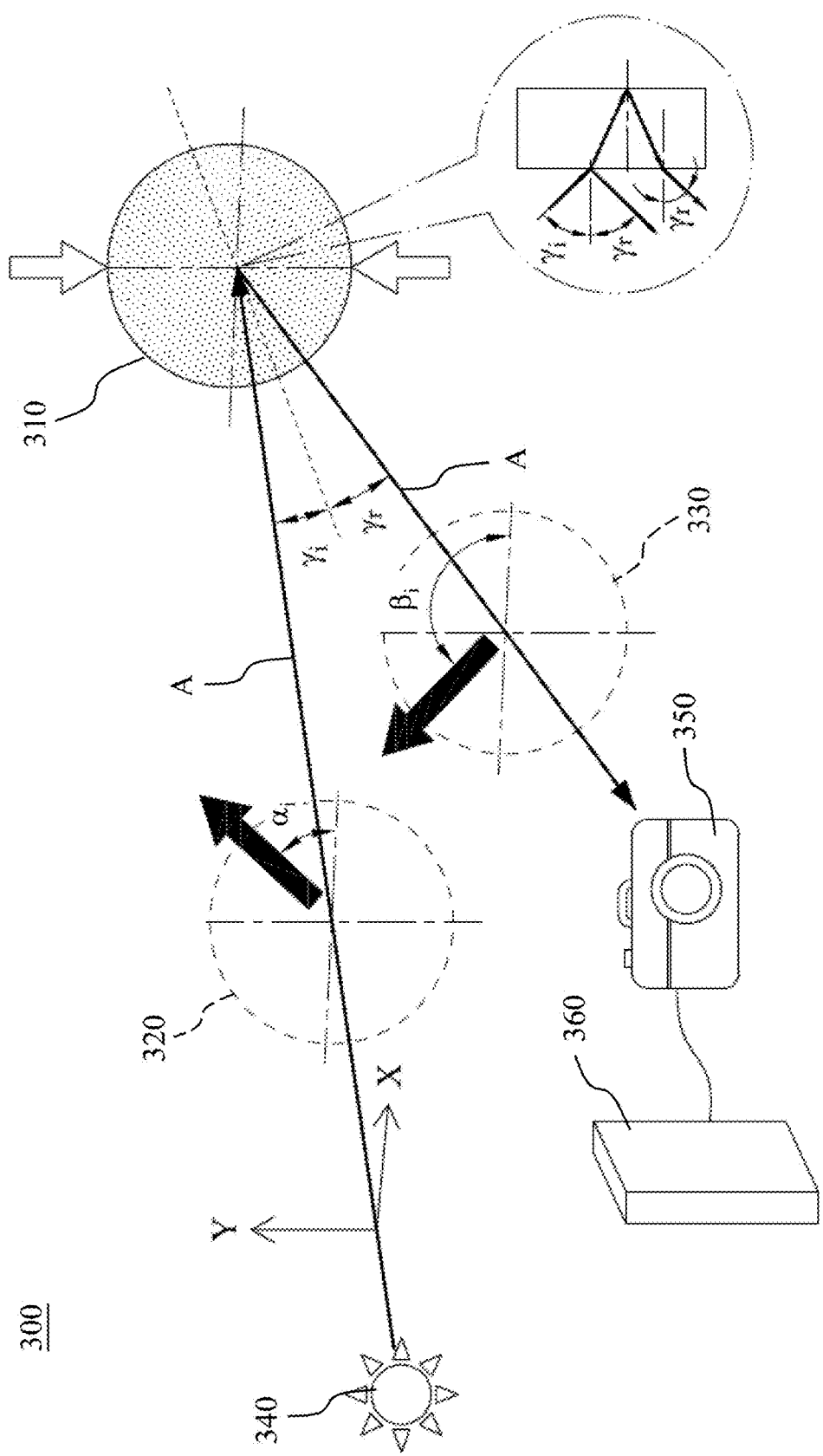
FIG. 4 is a schematic diagram showing a stress measurement system using the stress measurement method of FIG. 3.
Figure 5B:
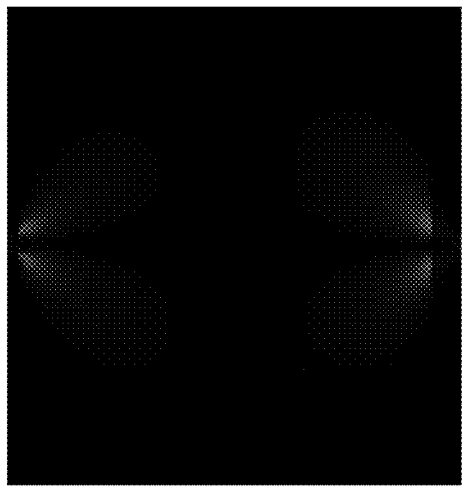
FIGS. 5A to 5D show light intensity images of a sample (glass disc) having a 91.5 kg loading, measured by a transmission type stress measurement system.
Figure 5D:
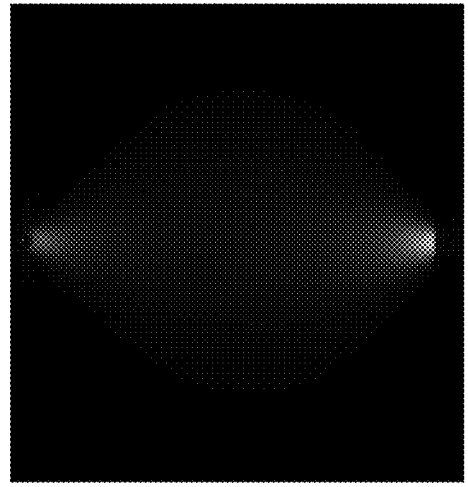
Figure 5A:
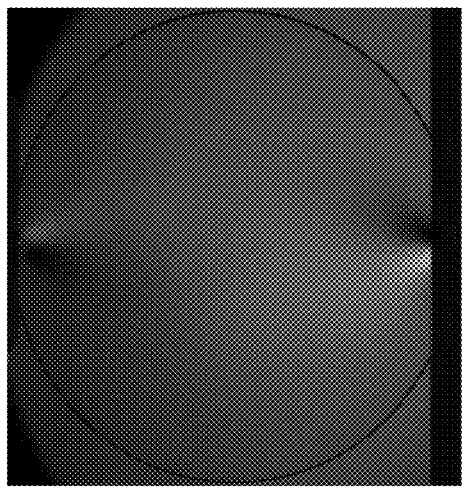
Figure 5C:
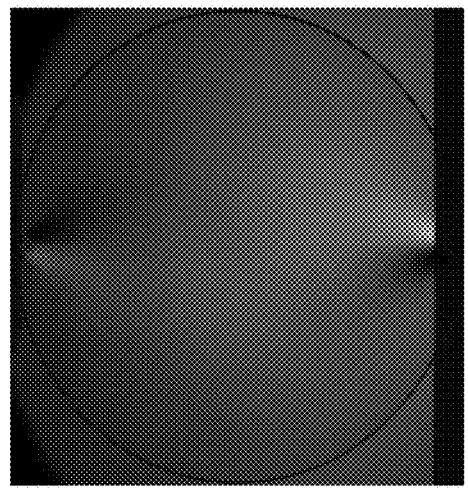

Please refer to the FIGS. 3 and 4, another embodiment of a stress measurement method 100A of the present disclosure is provided. The stress measurement method 100A includes a reflection photoelasticity calibration procedure 111A, an image capturing procedure 110A, a phase shift calculation procedure 120A, an isochromatic intensifying procedure 130A and a transformation procedure 140A. In FIG. 4, a stress measurement device 300 employing the stress measure method 100A is shown. The stress measurement system 300 includes a sample 310, a calibration specimen (not shown), a polarizer 320, an analyzer 330, a light source 340, an image capturing device 350 and a calculating device 360. The sample 310 has optical transmission property and/or reflection property. The polarizer 320 is located in a first side of the sample 310 (or the calibration specimen), the analyzer 230 is located in a second side of the sample 310 and an angle $\gamma_i + \gamma_r$ (i.e. an incident angle $\gamma_i$ + a reflection angle $\gamma_r$) is formed between the first side and the second side. The light source 340 is located outside the polarizer 320. The light source 340 irradiates a light A. The light A passes through the polarizer 320 and is reflected by the sample 310 to the analyzer 230. The image capturing device 350 is located outside the analyzer 330 for receiving the light A, and the image capturing device 350 can capture light intensity images, calibration light intensity images or intensified isochromatic light intensity images. The calculating device 360 is connected to the capturing device 350 for executing the reflection photoelasticity calculation procedure 111A, phase sift calculation procedure 120A, the isochromatic intensifying procedure 130A and the transformation procedure 140A.

The light intensity into the image capturing device 350 has two portions: a light intensity reflected by a front surface of the sample 310 and a light intensity reflected by a rear surface and passing through the front surface of the sample 310. When there is an internal stress, birefringence will occur in the sample 310. Since the light intensity reflected by the front surface of the sample 310 does not enter the internal portion of the material, the light intensity doesn't include the information of the principal stress angle and the principal stress difference. However, the light intensity reflected by the rear surface and passing through the front surface of the sample 310 has entered the internal portion of the material and is influenced by the temporary birefringence, the light intensity includes the information of the principal stress angle and the principal stress difference. Therefore, when the stress measurement system 300 (i.e. reflection photoelasticity instrument) is set up as a reflection plane polarization field, a light intensity general equation Ioi of the sample 310 (captured by the image capturing device 350) can be represented by the following equation (21):

$$I_{Oi} = I_B + I_A\left[\cos^2\frac{\delta}{2}\cos^2(\beta_i - \alpha_i) + \sin^2\frac{\delta}{2}\cos^2(\beta_i + \alpha_i - 2\theta)\right] + \quad (21)$$
$$(-Er_p\cos\alpha_i\cos\beta_i + Er_s\sin\alpha_i\sin\beta_i)^2;$$

where $I_B$ and $I_A$ are a background of light intensity and an amplitude of light intensity under a reflection plane polarization field, respectively; E is an amplitude of an incident electric field after passing through the polarizer 320 and with a polarization direction of the polarizer 320; $r_p$ and $r_s$ are reflection rates of electric field amplitude in the parallel and perpendicular directions to the incident plane when the electric field is incident to the front surface of the sample 310 respectively, and the reflection rates of electric field amplitude can be obtained by the Fresnel Equations. Since the amplitude of the incident electric field E is an unknown quantity, it can be solved by using the calibration specimen. The calibration specimen is the same as the sample 310 and without internal stress. A light intensity general equation $I_{OCi}$ of the calibration specimen (captured by the image capturing device 350 when the stress measurement system 300 is set up as a reflection plane polarization field) can be represented by the following equation (22):

$$I_{OCi} = (-Er_p \cos\alpha_i \cos\beta_i + Er_s \sin\alpha_i \sin\beta_i)^2 + (-Et_p'r_p't_p' \cos\alpha \cos\beta_i + Et_s'r_s't_s' \sin\alpha_i \sin\beta_i)^2 \quad (22)$$

where $t_p$ and $t_s$ are transmission rates of electric field amplitude in the parallel and perpendicular directions to the incident plane when the electric field is incident to the front surface of the sample 310 respectively; $r_p$ and $r_s$ are reflection rates of electric field amplitude in the parallel and perpendicular directions to the incident plane when the electric field is incident to the front surface of the sample 310, respectively; $r_p'$ and $r_s'$ are reflection rates of electric field amplitude in the parallel and perpendicular directions to the incident plane when the electric field which passes through the front surface of the calibration specimen is incident to the rear surface of the calibration specimen, respectively; $t_p'$ and $t_s'$ are transmission rates of electric field amplitude in the parallel and perpendicular directions to the incident plane when the electric field is incident from the rear surface of the calibration specimen to the front surface of the calibration specimen, respectively. The aforementioned reflection rates or transmission rates of electric field amplitude can be obtained by the Fresnel Equation. In the equation (22), the unknown quantity E can be solved by applying at least one light intensity image into the reflection photoelasticity calibration procedure 111A. When E is solved, the four unknown quantities in the equation (21) can be therefore solved, and the stress value of the sample 310 can be obtained through the image capturing procedure 110A, the phase shift calculation procedure 120A, the isochromatic intensifying procedure 130A and the transformation procedure 140A, as shown in FIG. 3 of the present disclosure. In one embodiment, the aforementioned calculating device 360 can be a computer.

In the reflection photoelasticity calibration procedure 111A, two calibration light intensity images of the calibration specimen are captured by the image capturing device 350 when the angles of the polarizer 320 and the analyzer 330 are rotated to $\alpha_1=0$ degree and $\beta_1=45$ degrees as well as $\alpha_3=45$ degrees and $\beta_3=90$ degrees, respectively. The light intensity equations of the two calibration light intensity images can be derived from the equation (22) as shown in the following equations (23) and (24);

$$I_{oc_1} = \frac{1}{2}E^2[r_p^2 + (t_p r_p' t_p')^2] \quad (\alpha_1 = 0°, \beta_1 = 45°); \text{ and} \quad (23)$$

$$I_{oc_3} = \frac{1}{2}E^2[r_s^2 + (t_s r_s' t_s')^2] \quad (\alpha_3 = 45°, \beta_3 = 90°). \quad (24)$$

Theoretically, E can be solved from the equation (23) or the equation (24) independently. However, if the equations (23) and (24) are considered as simultaneous equations, a more accurate E can be obtained by eliminating the noise of the system. Therefore, E can be obtained by the following equation (25):

$$E = \sqrt{\frac{2(I_{oc_1} + I_{oc_3})}{r_p^2 + (t_p r_p' t_p')^2 + r_s^2 + (t_s r_s' t_s')^2}}. \quad (25)$$

After performing the reflection photoelasticity calibration procedure 111A, the image capturing procedure 110A and the phase shift calculation procedure 120A are then performed. The light intensity equations of the sample 310 under four different phase angles can be represented as the following equations (26) to (29):

$$I_{o_1} = \frac{1}{2}E^2 r_p^2 + I_B + I_A\left[\frac{1}{2} + \frac{1}{2}\sin^2\frac{\delta}{2}\sin 4\theta\right] \quad (\alpha_1 = 0°, \beta_1 = 45°); \quad (26)$$

$$I_{o_2} = I_B + I_A\left[\frac{1}{2}\sin^2\frac{\delta}{2}(1 - \cos 4\theta)\right] \quad (\alpha_2 = 0°, \beta_2 = 90°); \quad (27)$$

$$I_{o_3} = \frac{1}{2}E^2 r_s^2 + I_B + I_A\left[\frac{1}{2} - \frac{1}{2}\sin^2\frac{\delta}{2}\sin 4\theta\right] \quad (\alpha_3 = 45°, \beta_3 = 90°); \quad (28)$$

and $$I_{o_4} = \quad (29)$$
$$\frac{1}{4}E^2(r_p + r_s)^2 + I_B + I_A\left[\frac{1}{2}\sin^2\frac{\delta}{2}(1 + \cos 4\theta)\right] \quad (\alpha_4 = 45°, \beta_4 = 135°).$$

Since E is already obtained from the equation (25), the relationships of the light intensity values with $\sin^2(\delta/2)$ and $\cos^2(\delta/2)$ and without $\theta$ can be represented as the following equations (30) and (31):

$$\sqrt{\left[I_{o_1} - I_{o_3} + \frac{1}{2}E^2(r_s^2 - r_p^2)\right]^2 + \left[I_{o_4} - \frac{1}{4}E^2(r_p + r_s)^2 - I_{o_2}\right]^2} = I_A \sin^2\frac{\delta}{2}; \quad (30)$$

and $$\left[I_{o_1} + I_{o_3} - \frac{1}{2}E^2(r_p^2 + r_s^2)\right] - \left[I_{o_4} - \frac{1}{4}E^2(r_p + r_s)^2 + I_{o_2}\right] = I_A \cos^2\frac{\delta}{2}. \quad (31)$$

The isochromatic retardation $\delta$ can be obtained by simultaneously solving the equations (30) and (31), and the relationship of the isochromatic retardation $\delta$ can be represented by the following equation (32):

$$\delta = 2\tan^{-1}\sqrt{\frac{\sqrt{\left[I_{o_1} - I_{o_3} + \frac{1}{2}E^2(r_s^2 - r_p^2)\right]^2 + \left[I_{o_4} - \frac{1}{4}E^2(r_p + r_s)^2 - I_{o_2}\right]^2}}{\left[I_{o_1} + I_{o_3} - \frac{1}{2}E^2(r_p^2 + r_s^2)\right] - \left[I_{o_4} - \frac{1}{4}E^2(r_p + r_s)^2 + I_{o_2}\right]}}. \quad (32)$$

The relationship of the principal stress angle $\theta$ can be represented as the following equation (33):

$$\theta = \frac{1}{4}\tan^{-1}_{2\pi}\left[\frac{I_{o_1} - I_{o_3} + \frac{1}{2}E^2(r_s^2 - r_p^2)}{I_{o_4} - \frac{1}{4}E^2(r_p + r_s)^2 - I_{o_2}}\right]. \quad (33)$$

When the light intensity of any one of the four light intensity images is insufficient, the isochromatic intensifying procedure 130A can be performed. Two enhanced light intensities $I_{O2\_E}$ and $I_{O4\_E}$ can be obtained by increasing the exposure time of the image capturing device 350 to make the image capturing device 350 capture the light intensity images under the dark fields (i.e. the situations of equations (27) and (29)). The enhanced light intensity equations can be represented by the following equations (34a) and (34b):

$$I_{o2\_E} = I_{B\_E} + I_{A\_E}\left[\frac{1}{2}\sin^2\frac{\delta}{2}(1 - \cos 4\theta)\right] \quad (\alpha_2 = 0°, \beta_2 = 90°); \quad (34a)$$

and $$I_{o4\_E} = \frac{1}{4}E_E^2(r_p + r_s)^2 + I_{B\_E} + I_{A\_E}\left[\frac{1}{2}\sin^2\frac{\delta}{2}(1 + \cos 4\theta)\right] \quad (\alpha_4 = 45°, \beta_4 = 135°). \quad (34b)$$

where $\delta$ is an isochromatic ratardation, $I_{B\_E}$ is a background of light intensity of the isochromatics after increasing the exposure time of image capturing device 350 (i.e. a background of intensified isochromatics light intensity value), $I_{A\_E}$ is an amplitude of light intensity of the isochromatic after increasing the exposure time of image capturing device 350 (i.e. an amplitude of intensified isochromatic light intensity value), s is an original exposure time, and $s_E$ is an enhanced exposure time. $r_p$ and $r_s$ are reflection rates of electric field amplitude in the parallel and perpendicular directions to the incident plane when the electric field is incident to the front surface of the sample 310, respectively. $E_E$ is a total value of the amplitude of the incident electric field E during the increased exposure time $s_E$. Then, an enhanced light intensity can be obtained by combining the equations (34a) and (34b), as shown in the following equation (35):

$$I_{o4\_E} + I_{o2\_E} = 2I_{B\_E} + \frac{1}{4}E_E^2(r_p + r_s)^2 + I_{A\_E}\sin^2\frac{\delta}{2}. \quad (35)$$

An equation (36) can be obtained by rewriting the equation (35):

$$\frac{I_{o4\_E} + I_{o2\_E} - \frac{1}{4}E_E^2(r_p + r_s)^2 - 2I_{B\_E}}{I_{A\_E}} = \sin^2\frac{\delta}{2}. \quad (36)$$

In the equation (36), $I_{B\_E}$ can be obtained by using the conventional calibration technology. For example, $I_{B\_E}$ can be obtained by applying a fitting processing of a sine regression function or a calibration specimen without stress. The relationship between $I_{A\_E}$, the exposure time s and the increased exposure time $s_E$ can be represented by the following equation (37), and the relationship between $E_E$, the exposure time s and the enhanced exposure time $s_E$ can be represented by the following equation (38):

$$I_{A\_E} = I_A \frac{s_E}{s}; \quad (37)$$

and $$E_E^2 = E^2 \frac{s_E}{s}. \quad (38)$$

where $I_A$ can be obtained by combining the equations (30) and (31). The isochromatic retardation $\delta$ can be obtained by substituting the equations (37) and (38) into the equation (36), and is represented by the following equation (39). Furthermore, the principal stress angle $\theta$ can be represented by the following equation (40);

$$\delta = 2\sin^{-1}\sqrt{\frac{I_{o4\_E} + I_{o2\_E} - 2I_{B\_E}}{I_A}\frac{s}{s_E} - \frac{1}{4}E^2(r_p + r_s)^2}; \quad (39)$$

and $$\theta = \frac{1}{2}\tan^{-1}\left(\frac{I_{o2\_E} - I_{B\_E}}{I_{o4\_E} - \frac{1}{4}E_E^2(r_p + r_s)^2 - I_{B\_E}}\right). \quad (40)$$

In fact, the above equations (37) and (38) may be different when using different image capturing device 350. However, the corresponding relationship of the isochromatic retardation $\delta$ can be obtained by substituting the changed equations of the equations (37) and (38) into the equation (36).

Finally, through the transformation procedure 140A, the isochromatic retardation $\delta$ can be transformed to a stress value in accordance with the Stress-Optic Law.

Figure 9B:
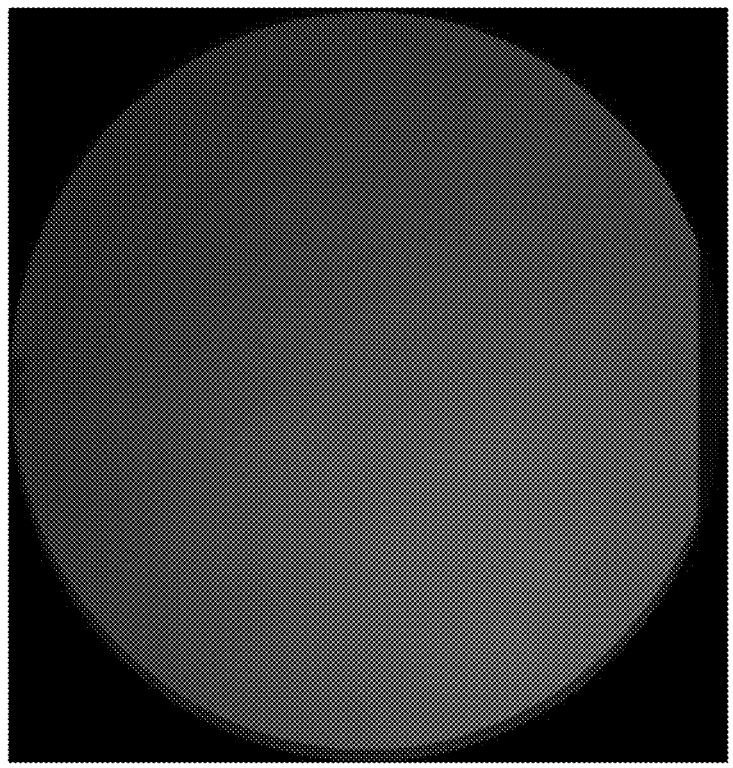
FIGS. 9A to 9B show light intensity images of a stress measurement system of an unloaded optical material under half bright fields.
Figure 9A:
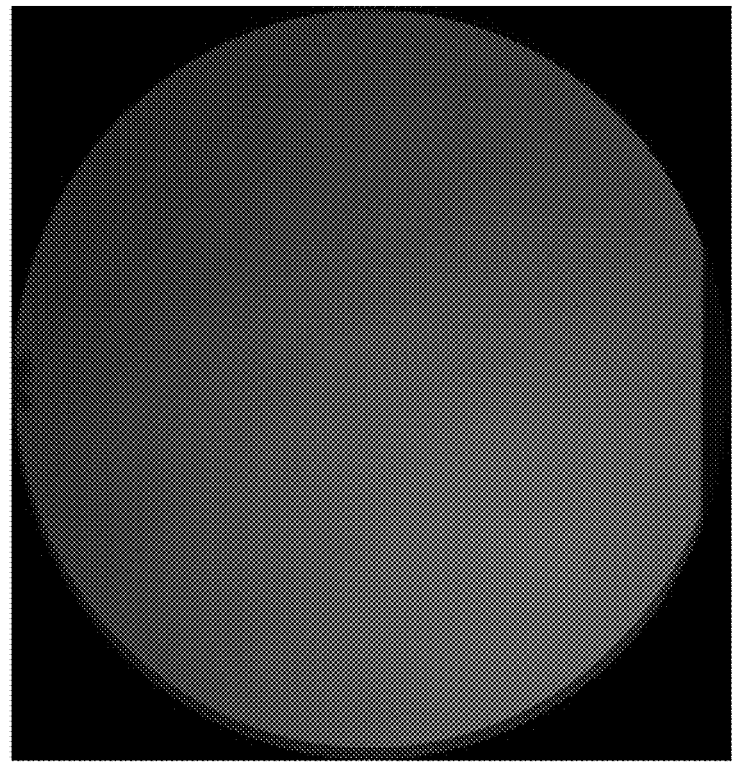
Figure 10B:
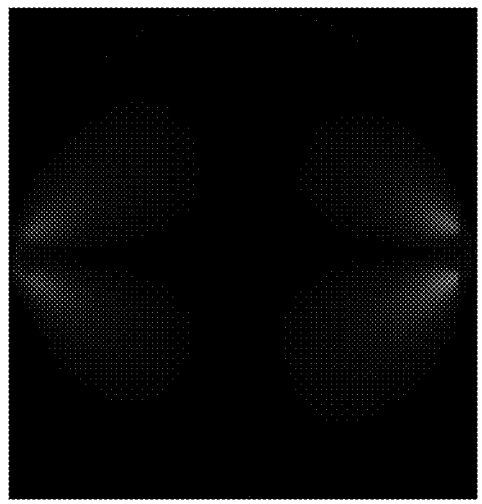
FIGS. 10A to 10D show light intensity images of a sample (glass disc) having a 91.5 kg load and measured by a reflection type stress measurement system.
Figure 10D:
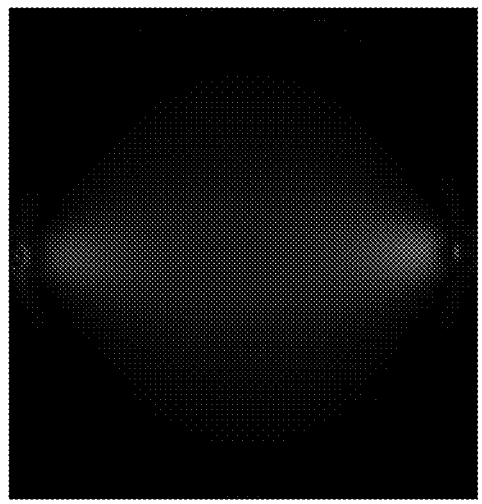
Figure 10A:
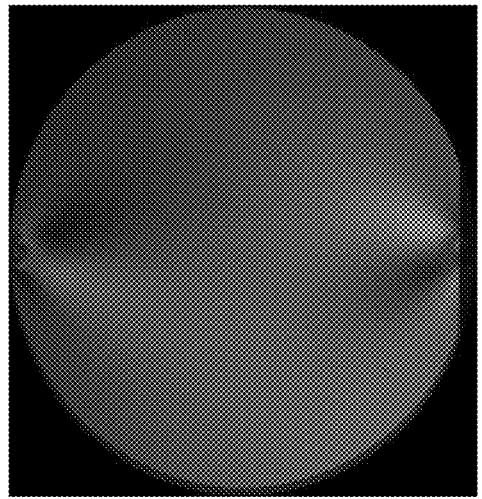
Figure 10C:
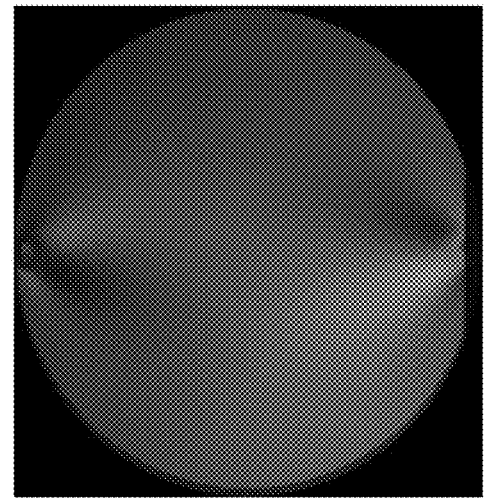

Please refer to FIGS. 9A to 14B. The stress measurement system 300 (referred as a reflection photoelasticity instrument) and the reflection type stress measurement method 100A are proposed to obtain more precise and accurate results. First the reflection photoelasticity calibration procedure 111A is performed. The calibration specimen is a glass disc with 4 mm thickness and without load (manufactured by the SCHOTT Company, Germany). Two light intensity images of the calibration specimen respectively corresponding to the equations (23) and (24) are obtained by the image capturing device 350, as FIGS. 9A to 9B shown. In the stress measurement system 300, the exposure time of a CCD camera (i.e. the image capturing device 350) is set to 4 seconds. Finally, the values of the two light intensity images can be substituted into the equations (25) for calculating the value of the amplitude of the incident electric field E.

Figure 11:
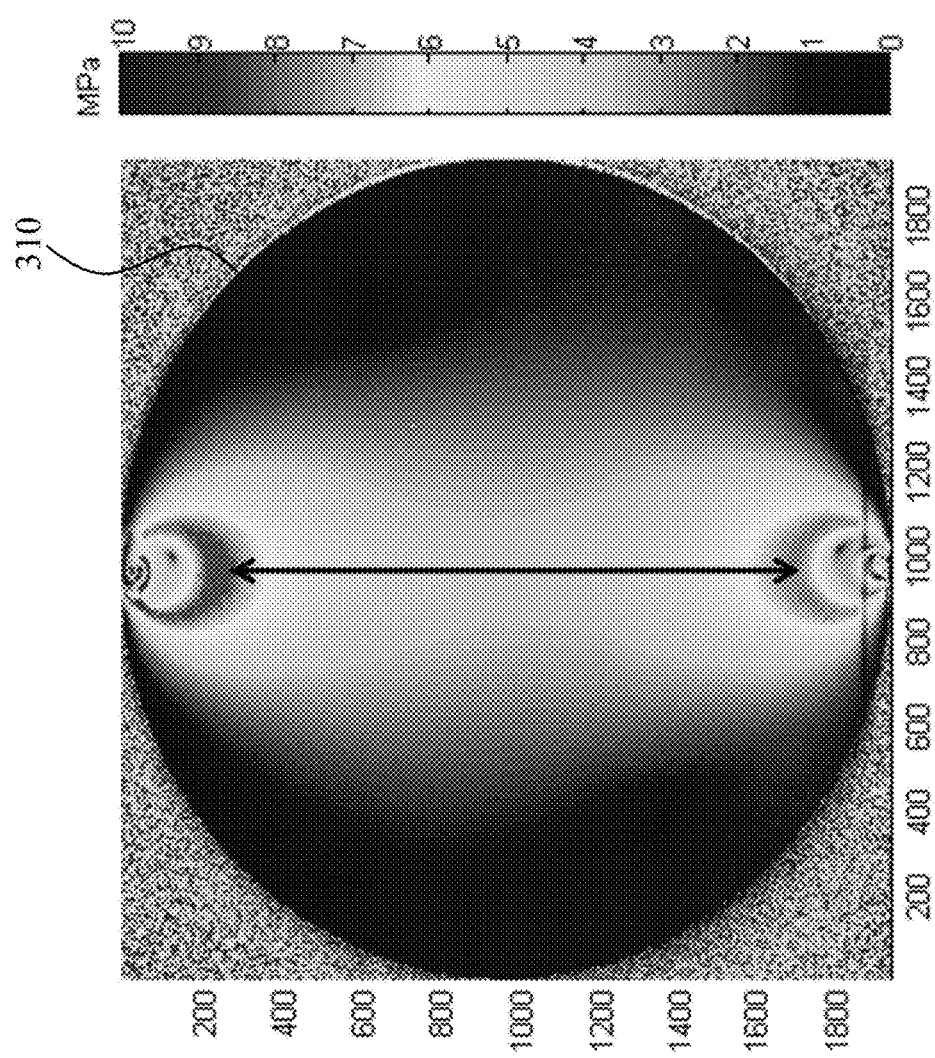
FIG. 11 shows a principal stress difference of the glass disc of FIGS. 10A to 10D, which is obtained from the reflection type stress measurement method.
Figure 12:
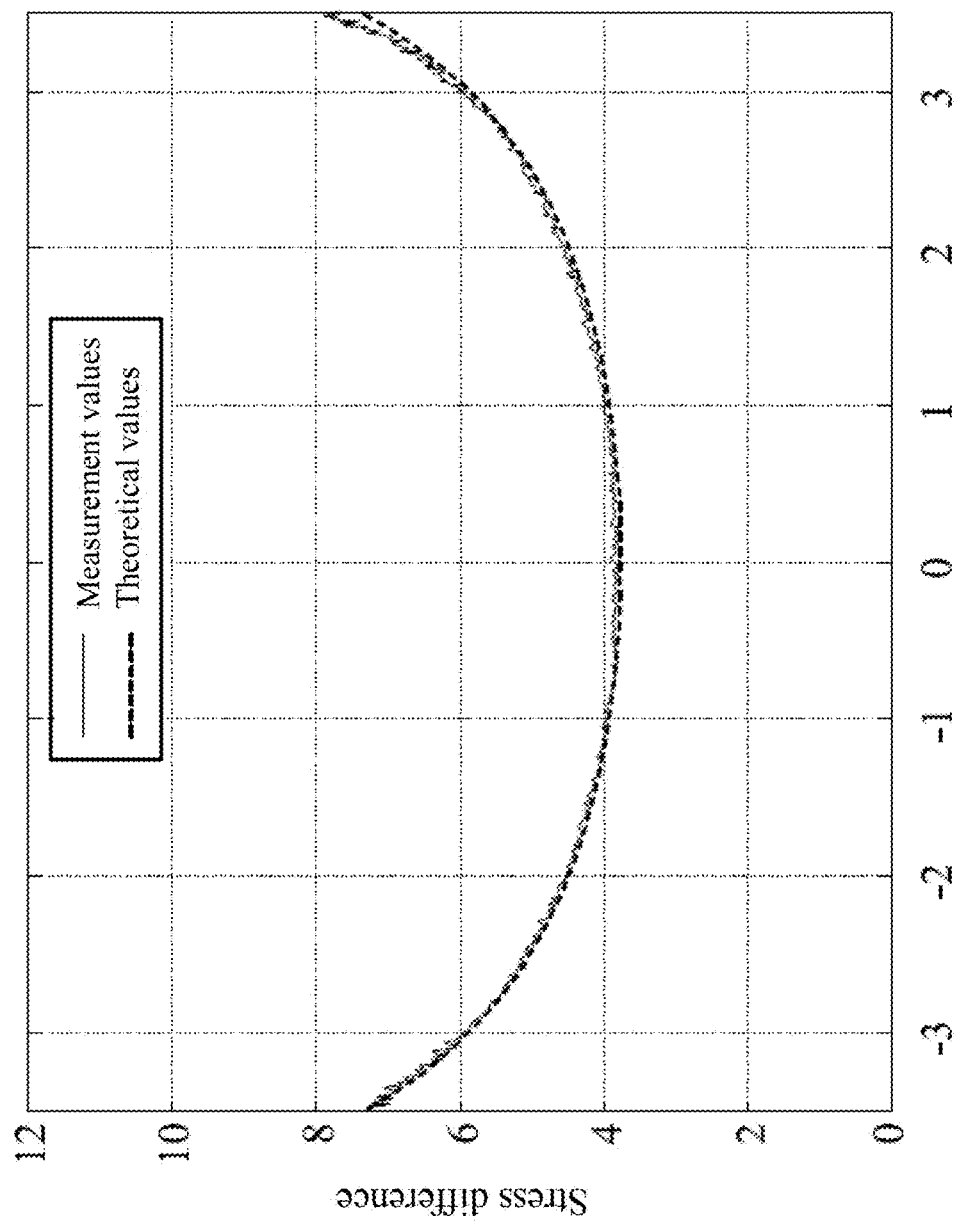
FIG. 12 shows a comparison diagram between measurement and theoretical values of the principal stress difference along the Y-axis diametrical direction of the glass disc of FIG. 11.

Then a diametrical load up to 91.5 kg are added to the glass disc to make the glass disc be as a sample 310. Four light intensity images of the sample 310 respectively corresponding to the equations (26) to (29) are obtained by the CCD camera. FIGS. 10A to 10D show the four light intensity images, respectively. The exposure time of the CCD camera is set to 4 seconds. The values of the four light intensity images respectively corresponding to the equations (26) to (29) and the value of the amplitude of the incident electric field E can be substituted into the equation (32) to obtain the isochromatic retardation δ of whole field, and the whole-field stress can be obtained by substituting the isochromatic retardation δ to the stress-optic law. The result of the whole-field principal stress difference of the sample 310 having 91.5 Kg load is shown in FIG. 11 by applying the reflection type stress measurement method (i.e. the stress measurement method 100A). The stress values of the points located within 3.71 cm range of the radius of the sample 310 along the Y-axis direction (shown as arrows) are extracted and compared with the theoretical values. The comparison result is shown in FIG. 12. In FIG. 12, the root mean square of the differences between the measurement values and the theoretical values is 0.1371 MPa, and the percentage of the average absolute value of the differences is 1.73%, which means a precise and accurate result can be achieved when using the stress measurement method 100A of the present disclosure.

The effects of the isochromatic intensifying procedure 130A of the stress measurement method 100A are verified in the following paragraphs.

Figure 13:
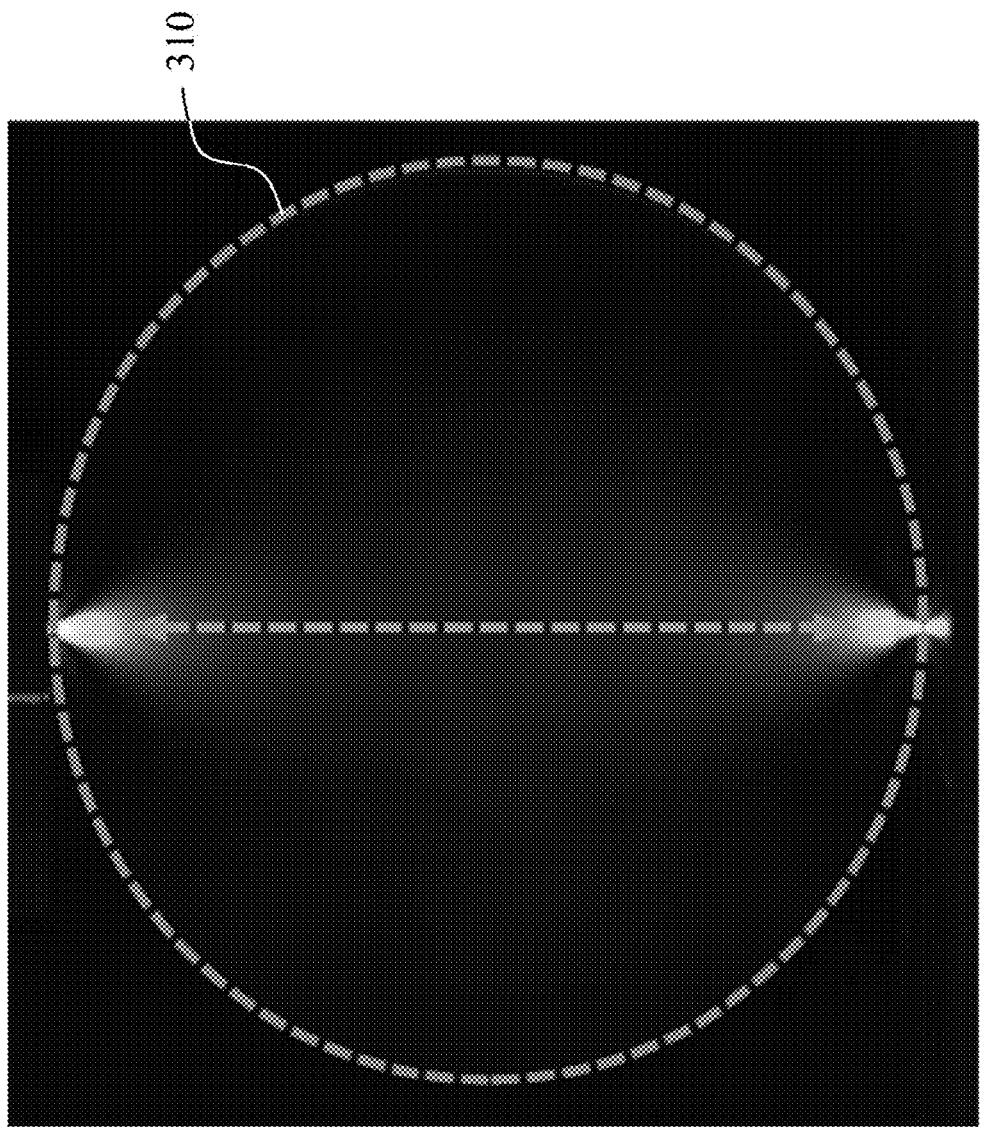
FIG. 13 shows a light intensity image of an enhanced light intensity $I_{O4\_E}$.
Figure 14A:
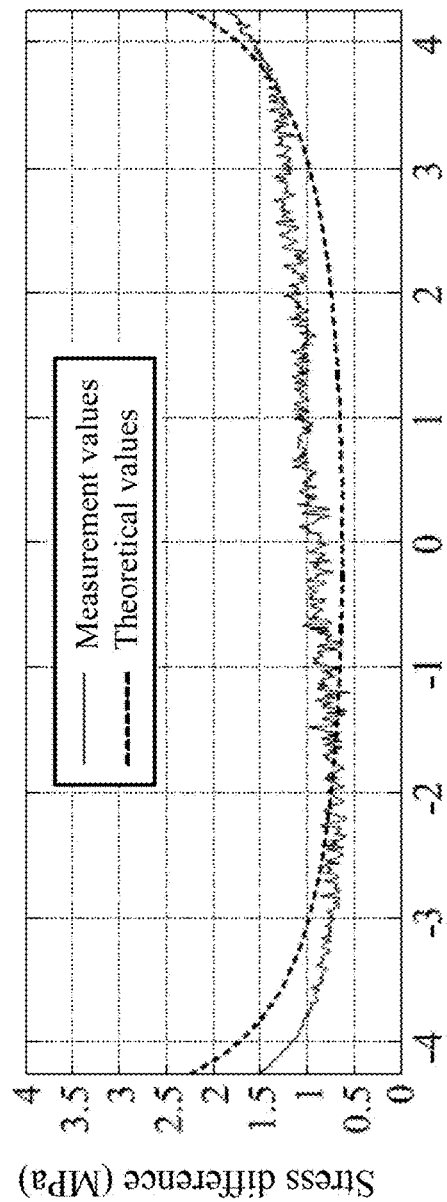
FIGS. 14A and 14B show comparison diagrams between calculation results and theoretical solutions before and after performing an isochromatic intensifying procedure.
Figure 14B:
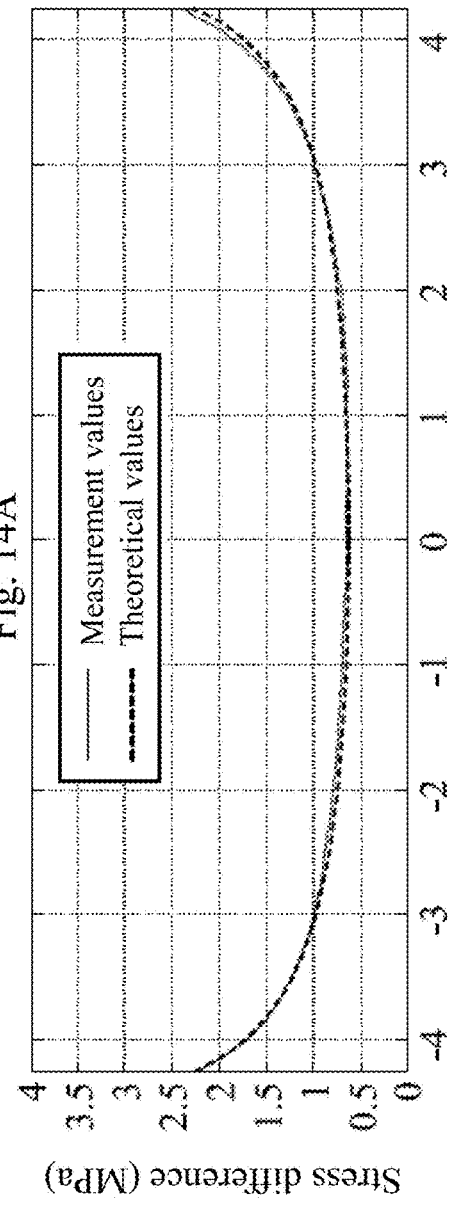

The sample 310 is a glass disc with 4 mm thickness manufactured by the SCHOTT Company. A 10 Kg diametrical load is added to the glass disc for forming a small internal stress. The exposure time s of the CCD camera is set to 0.8 second, the increased exposure time $s_E$ is set to 16 seconds. In FIG. 13, the light intensity image of the enhanced light intensity $I_{o4\_E}$ (referred to the equation (34b)) is shown and the position of the sample 310 is marked by dotted circle line. Then the stress measurement results within the dotted arrow line region are extracted out to be compared with the theoretical solutions. The comparison results are shown in FIGS. 14A and 14B. FIG. 14A shows the comparison between the stress measurement results without using the isochromatic intensifying procedure 130A (i.e. by using the equation (32)) and the theoretical values. It can be observed that there are significant differences between the measurement results and the theoretical values. FIG. 14B shows the comparison between the stress measurement results with using the isochromatic intensifying procedure 130A (i.e. by using the equation (39)) and the theoretical values. It can be seen that the measurement results are well matched with the theoretical values. The percentage of the average absolute difference is only 3.48%; therefore the correctness and accuracy of the stress measurement method 300 of the present disclosure is verified.

In sum, the present disclosure has the following advantages: (a) being capable of effectively performing the whole-field stress measurement, especially the low-level stress measurement; (b) having simple hardware architecture; and (c) capable of performing precise and accurate stress measurements to the samples having transmission property and/or reflection property.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A stress measurement method for a sample whose optical material has a transmission property, the stress measurement method comprising:
    an image capturing procedure to capture four light intensity images with four different phase angles of the sample;
    a phase shift calculation procedure to obtain an isochromatic retardation of the sample by calculating light intensity values of the four light intensity images when the four light intensity images have sufficient light intensity values;
    an isochromatic intensifying procedure to capture two intensified isochromatic light intensity images and obtain two enhanced light intensity values, a background of intensified isochromatic light intensity value and an amplitude of intensified isochromatic light intensity value when the sample is in a low stress condition so that a light intensity value of any one of the four light intensity images is insufficient, and then calculate the two enhanced light intensity values, the background of intensified isochromatic light intensity value and the amplitude of intensified isochromatic light intensity value to obtain the isochromatic retardation; and
    a transformation procedure to transform the isochromatic retardation to a stress value of the sample.

2. The stress measurement method of claim 1, wherein in the phase shift calculation procedure, the isochromatic retardation of the sample is δ, a principal stress angle of the sample is θ, the amplitude of light intensity is $I_a$, the background of light intensity is $I_b$, the phase shift calculation procedure is used to obtain two light intensity values with $\sin^2(\delta/2)$ and $\cos^2(\delta/2)$ as well as without θ by simultaneously calculating four light intensity values $I_1$, $I_2$, $I_3$ and $I_4$, then obtain the isochromatic retardation δ by simultaneously calculating the two light intensity values and obtain the principal stress angle θ by simultaneously calculating four light intensity values $I_1$, $I_2$, $I_3$ and $I_4$ through the following relationships:

$$\sqrt{(I_4 - I_2)^2 + (I_1 - I_3)^2} = I_a \sin^2 \frac{\delta}{2};$$

-continued $$I_1 + I_3 - I_4 - I_2 = I_a \cos^2 \frac{\delta}{2};$$

$$\delta = 2\tan^{-1}\sqrt{\frac{\sqrt{(I_4 - I_2)^2 + (I_1 - I_3)^2}}{I_1 + I_3 - I_4 - I_2}};$$

and $$\theta = \frac{1}{4}\tan^{-1}_{2\pi}\left(\frac{I_1 - I_3}{I_4 - I_2}\right).$$

3. The stress measurement method of claim 1, wherein in the isochromatic intensifying procedure, the isochromatic retardation of the sample is δ, the principal stress angle of the sample is θ, the background of intensified isochromatic light intensity value is $I_{b\_E}$, the amplitude of intensified isochromatic light intensity value is $I_{a\_E}$, an original exposure time is s, an enhanced exposure time is $s_E$, two enhanced light intensity values are $I_{4\_E}$ and $I_{2\_E}$, an original amplitude of light intensity value is $I_a$, and the amplitude of intensified isochromatic light intensity value $I_{a\_E}$, the the isochromatic retardation δ, and the principal stress angle θ can be obtained in the isochromatic intensifying procedure through the following relationships:

$$I_{a\_E} = I_a \frac{s_E}{s};$$

$$\delta = 2\tan^{-1}\sqrt{\frac{I_{4\_E} + I_{2\_E} - 2I_{b\_E}}{I_a} \cdot \frac{s}{s_E}};$$

and $$\theta = \frac{1}{2}\tan^{-1}\left(\frac{\sqrt{I_{2\_E} - I_{b\_E}}}{\sqrt{I_{4\_E} - I_{b\_E}}}\right).$$

4. The stress measurement method of claim 1, wherein in the isochromatic intensifying procedure, the intensified isochromatic light intensity image is obtained by means of increasing an exposure time of image capturing device.

5. The stress measurement method of claim 1, wherein in the isochromatic intensifying procedure, the intensified isochromatic light intensity image is obtained by means of increasing a light intensity of light source.

6. A stress measurement system employing the stress measurement method of claim 1, the stress measurement system comprising:
the sample;
a polarizer located in a first side of the sample;
an analyzer located in a second side opposite to the first side of the sample;
a light source located outside the polarizer and irradiating a light, wherein the light sequentially passes through the polarizer, the sample and the analyzer;
an image capturing device located outside the analyzer for receiving the light and capturing the light intensity images or the intensified isochromatic light intensity images; and
a calculating device connected to the image capturing device for performing the phase shift calculation procedure, the isochromatic intensifying procedure and the transformation procedure.

7. The stress measurement system of claim 6, wherein the sample is made of a glass, a polymer, a silicon wafer or a ceramic having a temporary birefringence.

8. A stress measurement method for a sample and a calibration specimen whose optical materials have transmission properties, the stress measurement method comprising:
a reflection photoelasticity calibration procedure for receiving calibration light intensity images of the calibration specimen and obtaining a value of an amplitude of an incident electric field;
an image capturing procedure to capture four light intensity images with four different phase angles of the sample;
a phase shift calculation procedure to obtain an isochromatic retardation of the sample by calculating light intensity values of the four light intensity images with the value of the amplitude of the incident electric field when the four light intensity images have sufficient light intensity values;
an isochromatic intensifying procedure to capture two intensified isochromatic light intensity images and obtain two enhanced light intensity values, a background of intensified isochromatic light intensity value and an amplitude of intensified isochromatic light intensity value when the sample is in a low stress condition so that a light intensity value of any one of the four light intensity images is insufficient, and then calculate the two enhanced light intensity values, the background of intensified isochromatic light intensity value, the amplitude of intensified isochromatic light intensity value and the value of the amplitude of the electric field to obtain the isochromatic retardation; and
a transformation procedure to transform the isochromatic retardation to a stress value of the sample.

9. The stress measurement method of claim 8, wherein in the reflection photoelasticity calibration procedure, two calibration light intensity values of two calibration light intensity images of the calibration specimen are $I_{oc1}$ and $I_{oc3}$; $t_p$ and $t_s$ are transmission rates of electric field amplitude in the parallel and perpendicular directions to the incident plane when the electric field is incident to the front surface of the sample, respectively; $r_p$ and $r_s$ are reflection rates of electric field amplitude in the parallel and perpendicular directions to the incident plane when the electric field is incident to the front surface of the sample, respectively; $r_p'$ and $r_s'$ are reflection rates of electric field amplitude in the parallel and perpendicular directions to the incident plane when the electric field which passes through the front surface of the calibration specimen is incident to the rear surface of the calibration specimen, respectively; $t_p'$ and $t_s'$ are transmission rates of electric field amplitude in the parallel and perpendicular directions to the incident plane when the electric field is incident from the rear surface of the calibration specimen to the front surface of the calibration specimen, respectively; the reflection photoelasticity calculation procedure obtains the value of the amplitude of the incident electric field E through the following relationship:

$$E = \sqrt{\frac{2(I_{oc_1} + I_{oc_3})}{r_p^2 + (t_p r_p' t_p')^2 + r_s^2 + (t_s r_s' t_s')^2}}.$$

10. The stress measurement method of claim 9, wherein in the phase shift calculation procedure, the isochromatic retardation is δ, a principal stress of the sample is θ, the phase shift calculation procedure is used to calculate two light intensity values with $\sin^2(\delta/2)$ and $\cos^2(\delta/2)$ as well as without θ by simultaneously calculating four light intensity values $I_{O1}$, $I_{O2}$, $I_{O3}$, $I_{O4}$ with the value of the amplitude of the incident electric field E and then obtain the isochromatic retardation δ by calculating the two light intensity values and obtain the principal stress angle θ by simultaneously calculating four light intensity values $I_{O1}$, $I_{O2}$, $I_{O3}$, $I_{O4}$ with the value of the amplitude of the incident electric field E through the following relationships:

$$\sqrt{\left[I_{o_1} - I_{o_3} + \frac{1}{2}E^2(r_s^2 - r_p^2)\right]^2 + \left[I_{o_4} - \frac{1}{4}E^2(r_p + r_s)^2 - I_{o_2}\right]^2} = I_A \sin^2\frac{\delta}{2};$$

$$\left[I_{o_1} + I_{o_3} - \frac{1}{2}E^2(r_p^2 + r_s^2)\right] - \left[I_{o_4} - \frac{1}{4}E^2(r_p + r_s)^2 + I_{o_2}\right] = I_A \cos^2\frac{\delta}{2};$$

$$\delta = 2\tan^{-1}\sqrt{\frac{\sqrt{\left[I_{o_1} - I_{o_3} + \frac{1}{2}E^2(r_s^2 - r_p^2)\right]^2 + \left[I_{o_4} - \frac{1}{4}E^2(r_p + r_s)^2 - I_{o_2}\right]^2}}{\left[I_{o_1} + I_{o_3} - \frac{1}{2}E^2(r_p^2 + r_s^2)\right] - \left[I_{o_4} - \frac{1}{4}E^2(r_p + r_s)^2 + I_{o_2}\right]}};$$

and $$\theta = \frac{1}{4}\tan^{-1}_{2\pi}\left[\frac{I_{o_1} - I_{o_3} + \frac{1}{2}E^2(r_s^2 - r_p^2)}{I_{o_4} - \frac{1}{4}E^2(r_p + r_s)^2 - I_{o_2}}\right].$$

11. The stress measurement method of claim 8, wherein in the isochromatic intensifying procedure, δ is a isochromatic ratradation, $I_{B\_E}$ is a background of intensified isochromatic light intensity value, $I_{A\_E}$ is an amplitude of intensified isochromatic light intensity value, S is an original exposure time, $S_E$ is an increased exposure time, $Io_{4\_E}$ and $Io_{2\_E}$ are two enhanced light intensity values, $r_p$ and $r_s$ are reflection rates of electric field amplitude in the parallel and perpendicular directions to the incident plane when the electric field is incident to the front surface of the sample, $I_A$ is an original amplitude of light intensity value, E is an amplitude of an incident electric field, $E_E$ is a total value of the amplitude of the incident electric field E during the enhanced exposure time $S_E$, and then the $I_{A\_E}$, $E_E$, isochromatic ratradation δ, and principal stress angle θ can be obtained in the isochromatic intensifying procedure through the following relationships:

$$I_{A\_E} = I_A \frac{S_E}{S};$$

$$E_E^2 = E^2 \frac{S_E}{S};$$

$$\delta = 2\sin^{-1}\sqrt{\frac{I_{o4\_E} + I_{o2\_E} - 2I_{B\_E}}{I_A}\frac{S}{S_E} - \frac{1}{4}E^2(r_p + r_s)^2};$$

and $$\theta = \frac{1}{2}\tan^{-1}\left(\frac{I_{o2\_E} - I_{B\_E}}{I_{o4\_E} - \frac{1}{4}E_E^2(r_p + r_s)^2 - I_{B\_E}}\right).$$

12. The stress measurement method of claim 8, wherein in the isochromatic intensifying procedure, the intensified isochromatic light intensity image is obtained by means of increasing an exposure time of image capturing device.

13. The stress measurement method of claim 8, wherein in the isochromatic intensifying procedure, the intensified isochromatic light intensity image is obtained by means of increasing a light intensity of light source.

14. A stress measurement system employing the stress measurement method of claim 8, the stress measurement system comprising:
    the sample and the calibration specimen;
    a polarizer located in a first side of the sample or the calibration specimen;
    an analyzer located in a second side, wherein an angle is formed between the first side and the second side;
    a light source located outside the polarizer and irradiating a light, wherein the light is reflected to the analyzer by the sample or the calibration specimen;
    an image capturing device located outside the analyzer for receiving the light and capturing the light intensity images, the calibration light intensity images or the intensified isochromatic light intensity images; and
    a calculating device connected to the image capturing device for performing the reflection photoelasticity calibration procedure, the phase shift calculation procedure, the isochromatic intensifying procedure and the transformation procedure.

15. The stress measurement system of claim 14, wherein the sample is made of a glass, a polymer, a silicon wafer or a ceramic having a temporary birefringence.

* * * * *